(12) United States Patent
Hitora et al.

(10) Patent No.: US 9,379,190 B2
(45) Date of Patent: Jun. 28, 2016

(54) CRYSTALLINE MULTILAYER STRUCTURE AND SEMICONDUCTOR DEVICE

(71) Applicant: FLOSFIA INC., Kyoto-shi, Kyoto (JP)

(72) Inventors: Toshimi Hitora, Kyoto (JP); Masaya Oda, Kyoto (JP); Akio Takatsuka, Kyoto (JP)

(73) Assignee: FLOSFIA, INC., Kyoto (JP)

( * ) Notice: Subject to any disclaimer, the term of this patent is extended or adjusted under 35 U.S.C. 154(b) by 0 days.

(21) Appl. No.: 14/577,986

(22) Filed: Dec. 19, 2014

(65) Prior Publication Data

US 2015/0325659 A1    Nov. 12, 2015

(30) Foreign Application Priority Data

May 8, 2014    (JP) .................................. 2014-097244

(51) Int. Cl.
*H01L 29/12* (2006.01)
*H01L 29/22* (2006.01)
(Continued)

(52) U.S. Cl.
CPC ............ *H01L 29/22* (2013.01); *H01L 21/0242* (2013.01); *H01L 21/0257* (2013.01); *H01L 21/02433* (2013.01); *H01L 21/02565* (2013.01); *H01L 21/02581* (2013.01); *H01L 29/04* (2013.01); *H01L 29/0619* (2013.01); *H01L 29/1066* (2013.01); *H01L 29/24* (2013.01);
(Continued)

(58) Field of Classification Search
CPC ...................... H01L 21/0242; H01L 21/02565; H01L 21/02628; H01L 29/24; H01L 21/0262; H01L 21/02631

USPC ................................................ 257/43, 71, 76
See application file for complete search history.

(56) References Cited

U.S. PATENT DOCUMENTS

| 2014/0217470 | A1  | 8/2014  | Sasaki |
| 2015/0194479 | A1* | 7/2015  | Kaneko ............... H01L 21/0237 257/43 |
| 2015/0279927 | A1* | 10/2015 | Hitora ............... H01L 21/02565 257/43 |

FOREIGN PATENT DOCUMENTS

| JP | 2009-081359 A | 4/2009 |
| JP | 2013-028480 A | 2/2013 |

(Continued)

OTHER PUBLICATIONS

Akaiwa, K., and S. Fujita, "Electrical Conductive Corundum-Structured α-Ga$_2$O$_3$ Thin Films on Sapphire With Tin-Doping Grown by Spray-Assisted Mist Chemical Vapor Deposition," Japanese Journal of Applied Physics 51(7R):070203-1-070203-3, Jul. 2012.

(Continued)

*Primary Examiner* — Dung Le
(74) *Attorney, Agent, or Firm* — Christensen O'Connor Johnson Kindness PLLC

(57) ABSTRACT

Provided is a crystalline multilayer structure which has good electrical properties and is useful for semiconductor devices. A crystalline multilayer structure includes a base substrate and a crystalline oxide semiconductor thin film disposed directly on the base substrate or with another layer therebetween and including a corundum-structured oxide semiconductor as a major component. The oxide semiconductor contains indium and/or gallium as a major component. The crystalline oxide semiconductor thin film contains germanium, silicon, titanium, zirconium, vanadium, or niobium.

13 Claims, 14 Drawing Sheets

(51) Int. Cl.
  H01L 21/02 (2006.01)
  H01L 29/772 (2006.01)
  H01L 29/778 (2006.01)
  H01L 29/808 (2006.01)
  H01L 29/812 (2006.01)
  H01L 29/872 (2006.01)
  H01L 29/04 (2006.01)
  H01L 29/24 (2006.01)
  H01L 29/66 (2006.01)
  H01L 29/06 (2006.01)
  H01L 29/10 (2006.01)
  H01L 29/739 (2006.01)
  *H01L 33/26* (2010.01)
  *H01L 33/42* (2010.01)

(52) U.S. Cl.
  CPC ...... H01L 29/66969 (2013.01); H01L 29/7393 (2013.01); H01L 29/7722 (2013.01); H01L 29/7787 (2013.01); H01L 29/8083 (2013.01); H01L 29/812 (2013.01); H01L 29/872 (2013.01); *H01L 21/02554* (2013.01); *H01L 33/26* (2013.01); *H01L 33/42* (2013.01); *H01L 2933/0016* (2013.01)

(56) References Cited

FOREIGN PATENT DOCUMENTS

| JP | 2013-058637 A | 3/2013 |
| WO | 2013/035843 A1 | 3/2013 |
| WO | 2014/050793 A1 | 4/2014 |

OTHER PUBLICATIONS

Sasaki, K., et al., "Si-Ion Implantation Doping in β-$Ga_2O_3$ and Its Application to Fabrication of Low-Resistance Ohmic Contacts," Applied Physics Express 6(8):086502-1-086502-4, Aug. 2013.

Zhao, J.L., et al., "UV and Visible Electroluminescence From a Sn:$Ga_2O_3$/n+-Si Heterojunction by Metal—Organic Chemical Vapor Deposition," IEEE Transactions on Electron Devices 58(5):1447-1451, May 2011.

Extended European Search Report mailed Sep. 21, 2015, issued in corresponding European Application No. 14 19 9100, 8 pages.

\* cited by examiner

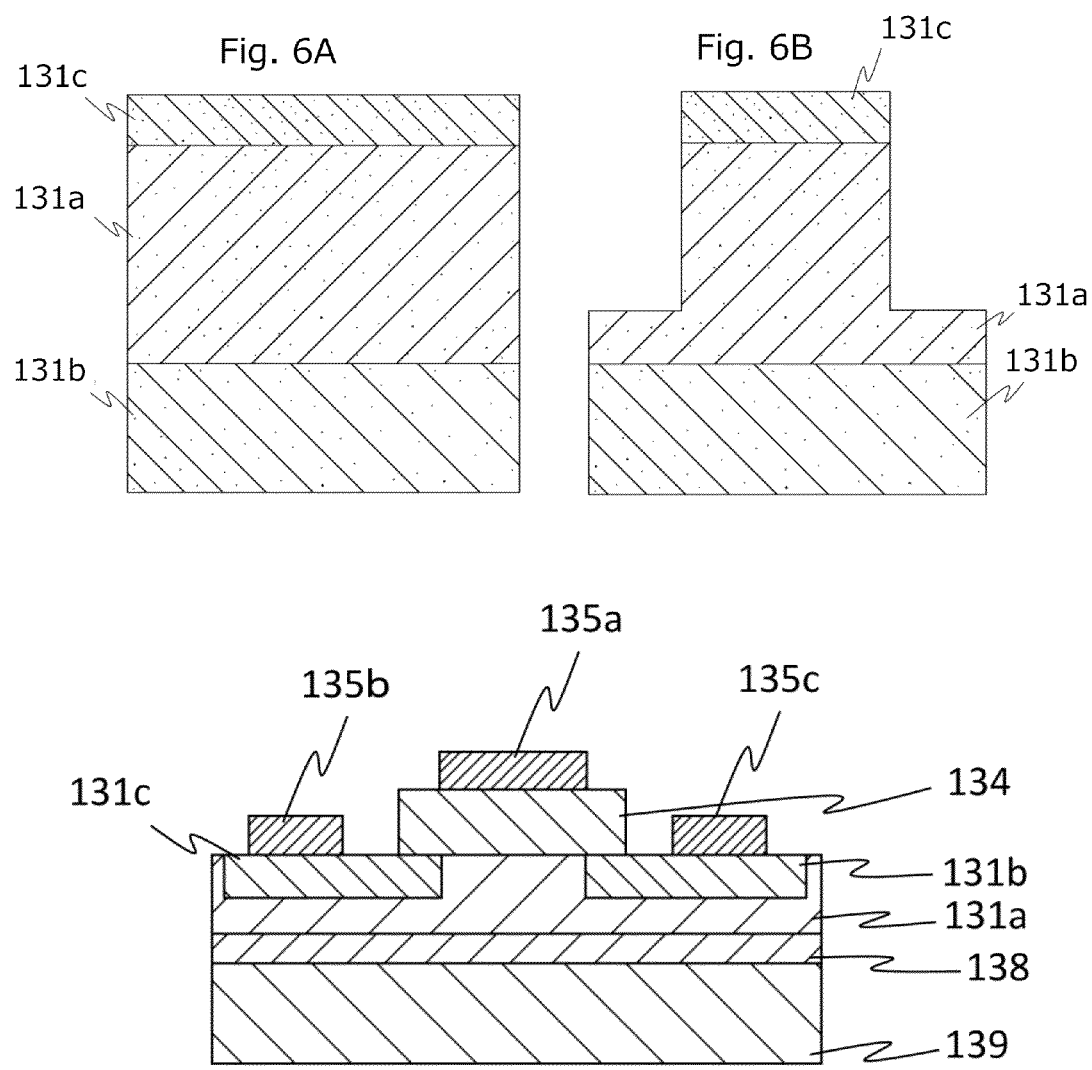

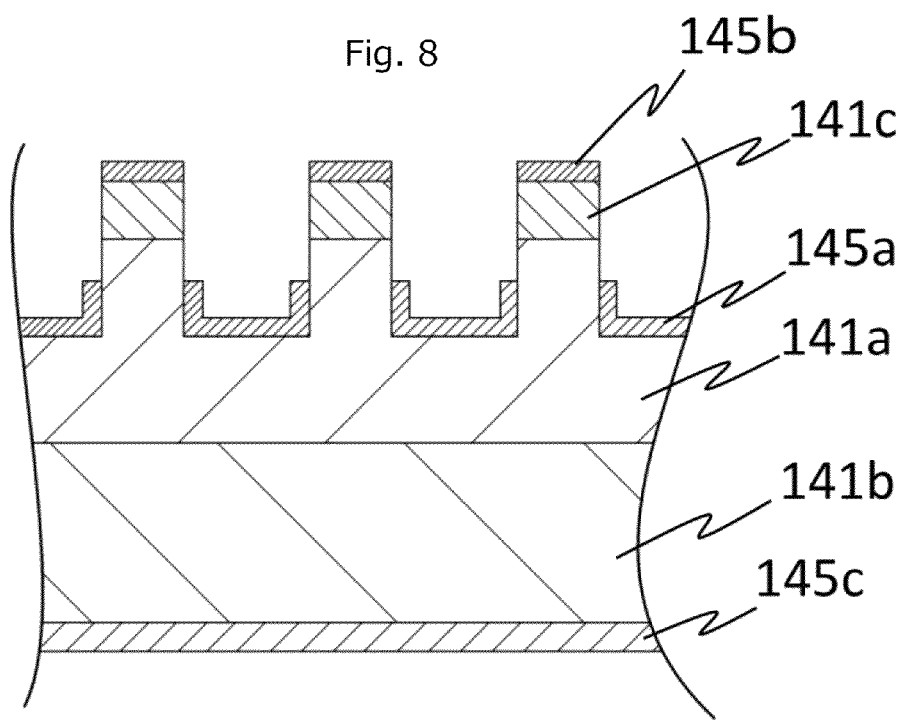
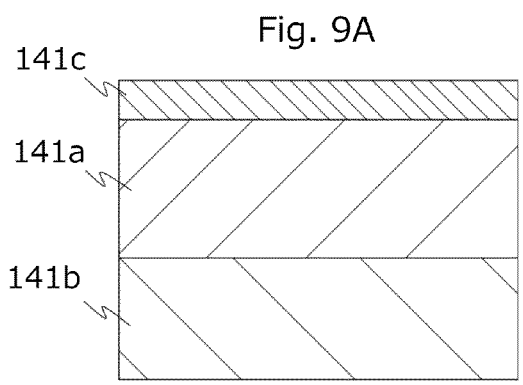
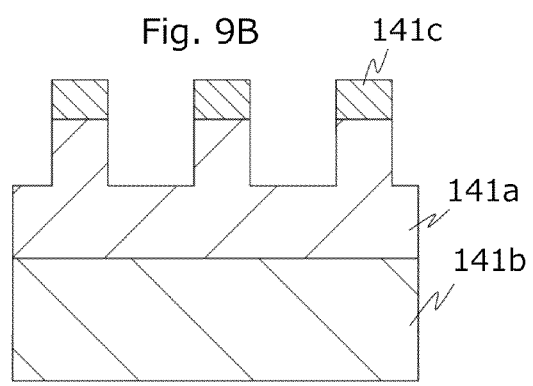

Fig. 18
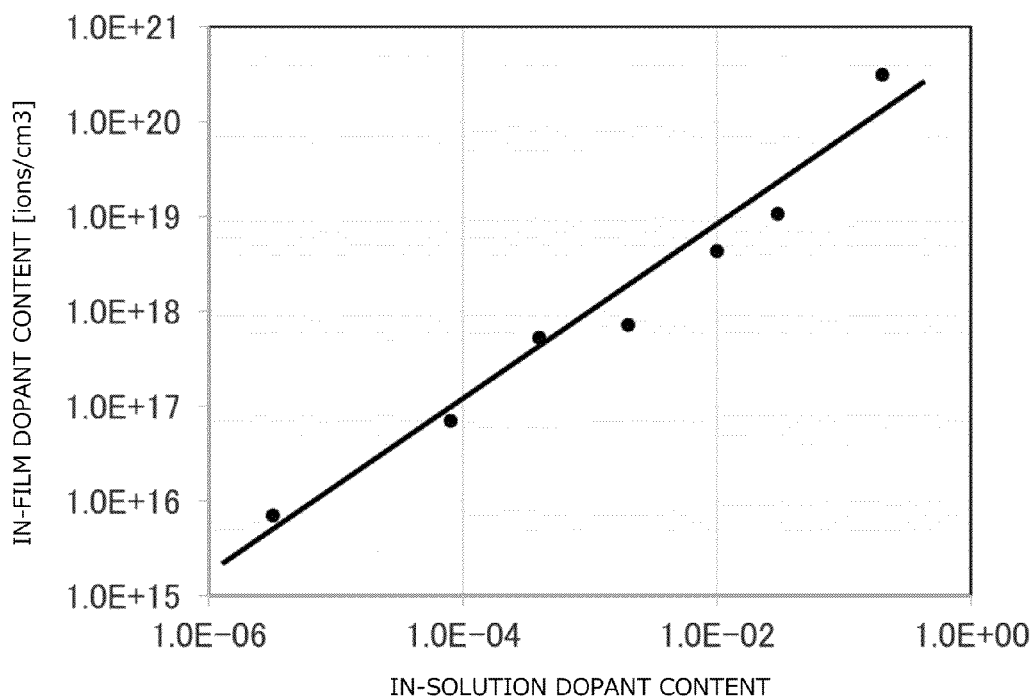
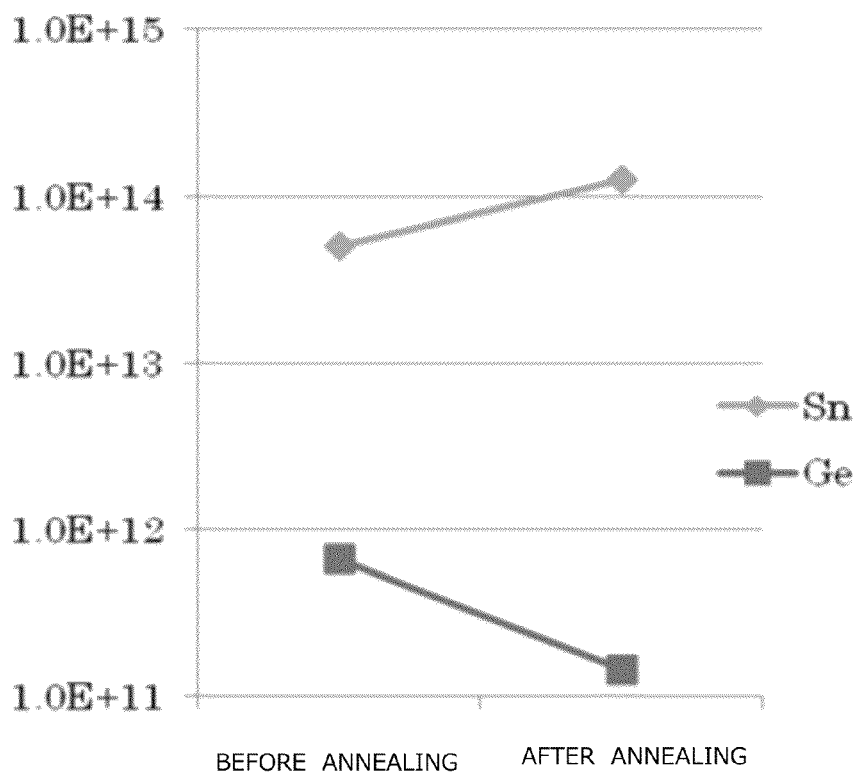
Fig. 19

US 9,379,190 B2

CRYSTALLINE MULTILAYER STRUCTURE AND SEMICONDUCTOR DEVICE

TECHNICAL FIELD

The present invention relates to a crystalline multilayer structure which is useful for semiconductor devices, and a semiconductor device including the crystalline multilayer structure.

BACKGROUND ART

Gallium oxide ($Ga_2O_3$) is a transparent semiconductor which has a wide band gap of 4.8 to 5.3 eV at room temperature and absorbs almost no visible light or ultraviolet light. For this reason, gallium oxide is a promising material for use in optical and electronic devices and transparent electronics which operate in the deep-ultraviolet region. Gallium oxide ($Ga_2O_3$)-based photodetectors, light-emitting diodes (LEDs), and transistors is being developed in recent years [see Non-Patent Literature 1 (Jun Liang Zhao et al, "UV and Visible Electroluminescence From a $Sn:Ga_2O_3$/n+-Si Heterojunction by Metal-Organic Chemical Vapor Deposition", IEEE Transactions on Electron Devices, VOL. 58, No. 5, May 2011)].

Gallium oxide ($Ga_2O_3$) has five crystal structures, $\alpha$, $\beta$, $\gamma$, $\sigma$, and $\epsilon$. Typically, the most stable structure is $\beta$-$Ga_2O_3$. However, as $\beta$-$Ga_2O_3$ has a $\beta$-galia structure, which is not a crystal structure commonly used as electronic materials or the like, the application of $\beta$-$Ga_2O_3$ to semiconductor devices is not always suitable. Further, growing a $\beta$-$Ga_2O_3$ thin film requires a high substrate temperature or high degree of vacuum, which would increase manufacturing costs. Furthermore, as described in Non-Patent Literature 2 (Kohei Sasaki et al, "Si-Ion Implantation Doping in $\beta$-$Ga_2O_3$ and Its Application to Fabrication of Low-Resistance Ohmic Contacts," Applied Physics Express 6 (2013) 086502), annealing at a high temperature of 800 to 1100° C. is required after a dopant is ion-implanted into $\beta$-$Ga_2O_3$ in order to use the dopant as a donor even when a high concentration (e.g., $1\times10^{19}$/cm$^3$ or higher) of dopant (Si) is used.

On the other hand, $\alpha$-$Ga_2O_3$ has the same crystal structure as sapphire substrates, which are already commercially available, and therefore is suitably used in optical and electronic devices. Currently, a gallium oxide thin film having electrical properties suitable for semiconductor devices has been desired.

SUMMARY OF THE INVENTION

Patent Literature 1 (Japanese Unexamined Patent Application Publication No. 2013-28480) discloses that while addition of tin to an $\alpha$-$Ga_2O_3$ thin film using $SnCl_2$ fails to provide the thin film with high electrical conductivity, addition of tin to an $\alpha$-$Ga_2O_3$ thin film using $SnCl_4$ allows electrical conductivity to be provided to the thin film. It also discloses that, among various kinds of dopants, tetravalent tin can provide a thin film with electrical conductivity. However, the method of Patent Literature 1 causes entry of a relatively large amount of carbon acting as a contamination into a thin film. Further, none of such electrical properties provided to a thin film by tin are satisfactory enough for use in semiconductor devices.

Patent Literature 2 (Japanese Unexamined Patent Application Publication No. 2013-58637) discloses an $\alpha$-$(Al_xGa_{1-x})_2O_3$ monocrystal thin film which is formed on an $\alpha$-$Al_2O_3$ substrate and which can contain a variety of dopants by ion implantation. However, ion implantation causes entry of dopant ions into interstitial sites and therefore it is needed to restore the thin film from the implantation damage by making the dopant ions move to the lattice points. Patent Literature 3 (Japanese Unexamined Patent Application Publication No. 2009-81359) discloses high-temperature annealing as means for moving dopant ions in the interstitial sites to the lattice points. Patent Literature 2 also discloses annealing at 800° C. or higher for 30 minutes or more after ion implantation. However, when an $\alpha$-$(Al_xGa_{1-x})_2O_3$ monocrystal thin film containing Ga as a major component is annealed at 800° C. or higher for 30 minutes or more, there occurs problems such as decomposition of the corundum structure into a $\beta$-galia structure, which is the most stable phase. Furthermore, ion implantation has problems such as decomposition of the corundum structure of the ion-implanted region into a $\beta$-galia structure or amorphization of such a region.

For the $\alpha$-$(Al_xGa_{1-x})_2O_3$ monocrystal thin film of Patent Literature 2, the present inventors did not form the monocrystal thin film by using MBE method, so they formed a crystalline oxide thin film at an atomic ratio of Al to Ga of 1:1 by the mist CVD instead of MBE and then annealed the thin film at 800° C. for 30 minutes. However, the present inventors observed, in the crystal phase, only a peak of a $\beta$-phase oxide crystal containing $\beta$-$Ga_2O_3$ as a major component. Even when the atomic ratio of Al to Ga was set to 2:1, a similar result was obtained. The present inventors then concluded that thin films as disclosed in Patent Literature 2 could not be used in semiconductor devices at all.

The object of the present invention is to provide a crystalline multilayer structure which has good electrical properties and is useful for semiconductor devices.

In order to achieve the above-mentioned objective, the present inventors have intensively investigated. As a result, they found that the following crystalline multilayer structure had better electrical properties and is more useful for semiconductor devices than those using Sn as a dopant and that the crystalline multilayer structure could solve all the problems with the traditional technologies. That is, the crystalline multilayer structure included a base substrate and a crystalline oxide semiconductor thin film disposed directly on the base substrate or with another layer therebetween and including a corundum-structured oxide semiconductor as a major component. The oxide semiconductor contained indium and/or gallium as a major component, and the crystalline oxide semiconductor thin film contained germanium, silicon, titanium, zirconium, vanadium, or niobium.

After obtaining the above findings, the present inventors conducted further examination and then completed the present invention.

The crystalline multilayer structure of the present invention has good electrical properties and is useful for semiconductor devices.

BRIEF DESCRIPTION OF THE DRAWINGS

FIGS. 6A and 6B are schematic diagrams showing part of a process of manufacturing the metal oxide semiconductor field-effect transistor (MOSFET) in FIG. 5;

FIG. 7 is a diagram schematically showing an example of a metal oxide semiconductor field-effect transistor (MOSFET) of the present invention;

FIG. 8 is a diagram schematically showing a preferred example of a static induction transistor (SIT) of the present invention;

FIGS. 9A and 9B are schematic diagrams showing a part of a process of manufacturing the SIT in FIG. 8;

FIG. 18 is a graph showing the relationship between an in-solution dopant content and an in-film dopant content in the Example of the present invention;

FIG. 19 is a graph showing that a Ge-doped oxide thin film is less likely to increase in resistance than a Sn-doped oxide thin film in the Example of the present invention;

DESCRIPTION OF EMBODIMENTS

Figure 1:
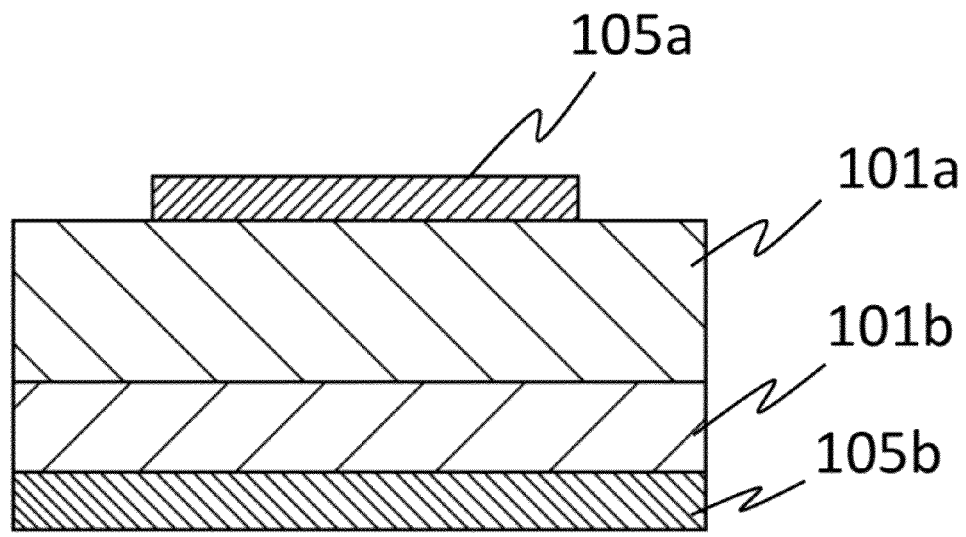
FIG. 1 is a diagram schematically showing a preferred example of a Schottky barrier diode (SBD) of the present invention.

A crystalline multilayer structure of the present invention includes a base substrate and a crystalline oxide semiconductor thin film disposed directly on the base substrate or with another layer therebetween and containing a corundum-structured oxide semiconductor as a major component. This crystalline multilayer structure is not particularly limited as long as the oxide semiconductor contains indium and/or gallium as a major component and the crystalline oxide semiconductor thin film contains germanium (Ge), silicon (Si), titanium (Ti), zirconium (Zr), vanadium (V) or niobium (Nb).

Base Substrate

The base substrate is not particularly limited as long as it serves as a base for the crystalline oxide semiconductor thin film. For example, the base substrate may be an insulator substrate, semiconductor substrate, or conductive substrate. In the present invention, the base substrate is preferably a substrate containing a corundum-structured crystal as a major component or substrate containing a β galia-structured crystal as a major component. The substrate including a corundum-structured crystal as a major component is not particularly limited as long as the content of the corundum-structured crystal in the substrate is 50% or more. In the present invention, the content is preferably 70% or more, more preferably 90% or more. Examples of the substrate including a corundum-structured crystal as a major component include sapphire substrates (e.g., c-plane sapphire substrates) and α-phase gallium oxide substrates. The substrate including a β galia-structured crystal as a major component is not particularly limited as long as the content of the β galia-structured crystal in the substrate is 50% or more. In the present invention, the content is preferably 70% or more, more preferably 90% or more. Examples of the substrate containing a β galia-structured crystal as a major component include β-$Ga_2O_3$ substrates and mixed crystal substrates containing $Ga_2O_3$ and $Al_2O_3$ in which the content of $Al_2O_3$ is 0 wt % or more and 60 wt % or less. Other examples of the base substrate include substrates having a hexagonal structure (e.g., SiC substrates, ZnO substrates, GaN substrates). If a substrate having a hexagonal structure is used, it is preferred to form the crystalline oxide semiconductor thin film directly on such a substrate or with another layer (e.g., buffer layer) therebetween. The thickness of the base substrate is not particularly limited, but is preferably 50 to 2000 μm, more preferably 200 to 800 μm.

In the present invention, the base substrate is preferably a sapphire substrate (e.g., c-plane sapphire substrate), an α-phase gallium oxide substrate, a β-$Ga_2O_3$ substrate, or a mixed crystal substrate containing $Ga_2O_3$ and $Al_2O_3$ in which the content of $Al_2O_3$ is 0 wt % or more and 60 wt % or less, more preferably a β-$Ga_2O_3$ substrate. By using such a preferable base substrate, the carbon content, carrier concentration, and half-width of the impurity in the crystalline oxide semiconductor thin film can be further reduced compared to those when other types of base substrates are used.

Crystalline Oxide Semiconductor Thin Film

The crystalline oxide semiconductor thin film is not particularly limited as long as it includes a corundum-structured oxide semiconductor as a major component in which the oxide semiconductor contains indium and/or gallium as a major component and the thin film contains germanium, silicon, titanium, zirconium, vanadium, or niobium. In the present invention, if a target component to which the "major component" is referred is an element, the "major component" means that the atomic percentage of the target component in the entire oxide semiconductor is preferably 50% or more, more preferably 70% or more, much more preferably 90% or more, and may be 100%. If a target component to which the "major component" is referred is a substance other than an element, the "major component" means that the mole percentage of the target component in the entire oxide semiconductor is preferably 50 mol % or more, more preferably 70 mol % or more, much more preferably 90 mol % or more, and may be 100 mol %. The crystalline oxide semiconductor thin film may be any of a monocrystalline film and a polycrystalline film. In the present invention, the crystalline oxide semiconductor thin film is preferably a monocrystalline film which may include a polycrystal.

The oxide semiconductor is not particularly limited as long as it has a corundum structure and contains indium and/or gallium as a major component. The oxide semiconductor may contain a metal other than indium and gallium, an oxide thereof, or the like as long as the objects of the present invention are not impaired. Examples of such a metal and an oxide thereof include one or more metals selected from Al, Fe, Cr, V, Ti, Rh, Ni, Co, and the like, and oxides thereof.

In the present invention, the corundum-structured oxide semiconductor is preferably α-phase $In_XAl_YGa_ZO_3$ where $0 \leq X \leq 2$, $0 \leq Y \leq 2$, $0 \leq Z \leq 2$, $X+Y+Z=1.5$ to $2.5$, and $0<X$ or $0<Z$, more preferably contains gallium. When the oxide semiconductor is α-phase $In_XAl_YGa_ZO_3$, though the composition is not limited to a particular composition as long as the objects of the present invention are not impaired, the atomic ratio of the sum of gallium, indium, and aluminum to all metal elements included in the crystalline oxide semiconductor thin film is preferably 0.5 or more, more preferably 0.8 or more. If the oxide semiconductor contains gallium, the atomic ratio of gallium to all metal elements included in the crystalline oxide semiconductor thin film is preferably 0.5 or more, more preferably 0.8 or more. The thickness of the crystalline oxide semiconductor thin film is not particularly limited, for example, may be less than 1 μm or 1 μm or more, but is preferably about 50 nm to 5 mm, more preferably 0.1 μm to 100 μm.

In the crystalline oxide semiconductor thin film, germanium, silicon, titanium, zirconium, vanadium, or niobium atoms usually reside on the lattice points of the crystal so that such atoms act effectively as donors.

Usually, the concentration of germanium, silicon, titanium, zirconium, vanadium, or niobium in the crystalline oxide semiconductor thin film is about $1 \times 10^{16}/cm^3$ to $1 \times 10^{22}/cm^3$. According to the present invention, by setting the concentration of germanium, silicon, titanium, zirconium, vanadium, or niobium in the crystalline oxide semiconductor thin film, for example, to as low as about $1 \times 10^{17}/cm^3$ or less, an n⁻-type semiconductor can be obtained. Further, according to the present invention, by setting the concentration of germanium, silicon, titanium, zirconium, vanadium, or niobium, for example, to as high as about $1 \times 10^{20}/cm^3$ or more, an n⁺-type semiconductor can be obtained. In the present invention, when forming an n⁻-type semiconductor layer, the concentration of germanium, silicon, titanium, zirconium, vanadium, or niobium in the crystalline oxide semiconductor thin film is preferably about $1 \times 10^{13}$ to $1 \times 10^{17}/cm^3$, more preferably about $1 \times 10^{15}$ to $1 \times 10^{17}/cm^3$. Further, in the present invention, when forming an n⁺-type semiconductor layer, the concentration of germanium, silicon, titanium, zirconium, vanadium, or niobium in the crystalline oxide semiconductor thin film is preferably about $1 \times 10^{20}/cm^3$ to $1 \times 10^{23}/cm^3$, more preferably about $1 \times 10^{21}/cm^3$ to $1 \times 10^{22}/cm^3$. By introducing germanium, silicon, titanium, zirconium, vanadium, or niobium into the crystalline oxide semiconductor thin film as described above, there can be obtained a crystalline oxide semiconductor thin film having better electrical properties than those using Sn as a dopant.

In the present invention, the crystalline oxide semiconductor thin film contains germanium, silicon, titanium, zirconium, vanadium, or niobium, preferably contains germanium. By introducing germanium into the crystalline oxide semiconductor thin film, the following properties of the crystalline multilayer structure are further improved: the controllability of electrical conductivity provided by doping, the heat resistance of the crystal structure, and the electrical thermotolerance. That is, the semiconductor properties of the crystalline multilayer structure are further improved.

The crystalline oxide semiconductor thin film may be formed directly on the base substrate or with another layer therebetween. Examples of the said another layer include corundum-structured crystal thin films having a different composition, non-corundum-structured crystal thin films, and amorphous thin films. The structure of the crystalline oxide semiconductor thin film may be any of a monolayer structure and a multilayer structure. Two or more crystal phases may be mixed in the same layer. If the crystalline oxide semiconductor thin film has the multilayer structure, it is formed by laminating thin films, for example, an insulating thin film and a conductive thin film. However, the present invention is not limited thereto. If the crystalline oxide semiconductor thin film has the multilayer structure in which the insulating thin film and the conductive thin film are laminated, the respective compositions of the two types of thin films may be the same or different. The thickness ratio of the conductive thin film to the insulating thin film is not particularly limited, but is preferably, for example, 0.001 to 100, more preferably 0.1 to 5. The more preferable ratio is, for example, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 3, 4, or 5, or may be between any two of the values presented.

In the present invention, the crystalline multilayer structure can be manufactured by the mist CVD. Specifically, the crystalline oxide semiconductor thin film containing a corundum-structured oxide semiconductor as a major component is formed by doping the crystalline oxide semiconductor thin film with germanium, silicon, titanium, zirconium, vanadium, or niobium serving as a dopant within the film forming process including the steps of atomizing a raw-material solution to generate raw-material fine particles and then carrying the raw-material fine particles onto a base substrate in a film-forming chamber using a carrier gas, and causing the raw-material compounds to react in the chamber. In the present invention, the crystalline oxide semiconductor thin film is preferably doped with an abnormal grain inhibitor by adding the abnormal grain inhibitor to the raw-material solution. By doping the crystalline oxide semiconductor thin film with the abnormal grain inhibitor in this manner, it is possible to efficiently and industrially advantageously manufacture a crystalline multilayer structure including a crystalline oxide semiconductor thin film whose surface roughness Ra is 0.1 μm or less. As used herein, the surface roughness (Ra) refers to an arithmetic average roughness value obtained by making a measurement according to JIS B0601. The amount of the dopant is not particularly limited unless the present invention is impaired, but the mole percent of the dopant in the raw-material solution is preferably 0.01 to 10%, more preferably 0.1 to 5%.

As used herein, the abnormal grain inhibitor refers to an inhibitor having an effect of reducing grains which are generated as byproducts in the film forming process. The abnormal grain inhibitor is not particularly limited as long as it can reduce the surface roughness of the crystalline oxide semiconductor thin film to 0.1 μm or less. In the present invention, the abnormal grain inhibitor preferably contains at least one selected from Br, I, F, and Cl. In order to form a film stably, it is possible to prevent an increase in surface roughness by introducing Br or I serving as an abnormal grain inhibitor into the thin film. The amount of an abnormal grain inhibitor to be added is not particularly limited as long as it can inhibit abnormal grains, but the volume percentage of the abnormal grain inhibitor in the raw-material solution is preferably 50% or less, more preferably 30% or less, most preferably between 1 to 30%. By using such a preferable amount of the abnormal grain inhibitor, there can be effectively inhibited growth of abnormal grains on the crystalline oxide semiconductor thin film to smooth the surface.

A method of forming the crystalline oxide semiconductor thin film is not particularly limited unless the present invention is impaired. For example, the crystalline oxide semiconductor thin film may be formed by causing a raw-material compound to react. Thus, a crystalline oxide semiconductor thin film can be grown on a base substrate from the base substrate side. The raw-material compound may be a gallium compound or a mixture of the gallium compound and other compound such as an indium compound, aluminum compound and so on according to the composition of the crystalline oxide semiconductor thin film. The gallium compound may be obtained by serving a gallium metal as a start material and converting it into a gallium compound immediately before forming a film. The gallium compound is, for example, an organometallic complex (e.g., an acetylacetonate complex, or the like) or halide (e.g., fluoride, chloride, bromide, or iodide) of gallium and, in the present invention, is preferably a halide (e.g., fluoride, chloride, bromide, or iodide) thereof. By using a halide of gallium as a raw-material compound and forming a film by the mist CVD, the amount of carbon in the crystalline oxide semiconductor thin film is made smaller than that of germanium, silicon, titanium, zirconium, vanadium, or niobium. Therefore, preferably, the crystalline oxide semiconductor thin film can be substantially free of carbon. Also it is preferred that the crystalline oxide semiconductor thin film of the present invention contains halogen (preferably Br) to form a favorable multilayer structure.

More specifically, the crystalline oxide semiconductor thin film can be formed by atomizing the raw-material solution having the raw-material compounds dissolved therein, generating the raw-material fine particles from the raw-material solution, carrying the raw-material fine particles into the film-forming chamber, and causing the raw-material compounds to react in the chamber. The solvent of the raw-material solution is not particularly limited, but is preferably water, hydrogen peroxide water, or organic solvent. In the present invention, the raw-material compounds are usually caused to react in the presence of a dopant raw material. The dopant raw material is preferably added to the raw-material solution and then atomized together with or separately from the raw-material compounds.

The dopant raw material is, for example, a metal elementary substance or a compound (e.g., halide, oxide) of germanium, silicon, titanium, zirconium, vanadium, or niobium.

In the present invention, the formed thin film may be annealed. The annealing temperature is not particularly limited, but is preferably 600° C. or less, more preferably 550° C. or less. By annealing the crystalline oxide semiconductor thin film at such a preferable temperature, the carrier concentration thereof can be controlled more favorably. The annealing time is not particularly limited as long as the objects of the present invention are not impaired, but is preferably 10 seconds to 10 hours, more preferably 10 seconds to one hour.

In the present invention, an oxide semiconductor layer and/or a nitride semiconductor layer (e.g., a GaN-based semiconductor layer, etc.) may be disposed directly on the crystalline oxide semiconductor thin film or with another layer therebetween.

The crystalline multilayer structure of the present invention is useful for various types of semiconductor devices, particularly for power devices. Semiconductor devices are categorized into lateral devices, where an electrode is formed on one side of a semiconductor layer, and vertical devices, where electrodes are formed on both front and back sides of a semiconductor layer. The crystalline multilayer structure of the present invention can be suitably used in both lateral devices and vertical devices, particularly in vertical devices. Examples of the semiconductor device include a Schottky barrier diode (SBD), a metal semiconductor field-effect transistor (MESFET), a high-electron-mobility transistor (HEMT), a metal oxide semiconductor field-effect transistor (MOSFET), a static induction transistor (SIT), a junction field-effect transistor (JFET), an insulated gate bipolar transistor (IGBT), and a light-emitting diode. In the present invention, the semiconductor device is preferably the SBD, the MESFET, the HEMT, the MOSFET, or the SIT. Further, in the present invention, the semiconductor device preferably includes no p-type semiconductor layer.

In using the crystalline multilayer structure of the present invention in a semiconductor device, it may be used in the semiconductor device either as it is or, for example, by stripping off the substrate therefrom, if necessary. If the crystalline oxide semiconductor thin film of the present invention, which contains a corundum-structured oxide semiconductor as a major component, is used as a semiconductor layer in a semiconductor device, it is possible to obtain the semiconductor device which is excellent in withstand voltage characteristics.

Now, preferred examples of use of the crystalline oxide semiconductor thin film of the crystalline multilayer structure of the present invention as an n-type semiconductor layer (including $n^+$-type semiconductors and $n^-$-type semiconductors) in a semiconductor device will be described with reference to the drawings. However, the present invention is not limited to these examples. The semiconductor devices described below may include another layer (e.g., an insulator layer, a semi-insulator layer, a conductor layer, a semiconductor layer, a buffer layer, or another intermediate layer) or the like as long as the object of the present invention is impaired, or a buffer layer or the like may be omitted if necessary.

SBD

FIG. 1 shows an example of a Schottky barrier diode (SBD) of the present invention. The SBD in FIG. 1 includes an $n^-$-type semiconductor layer 101a, an $n^+$-type semiconductor layer 101b, a Schottky electrode 105a, and an ohmic electrode 105b.

The material of the Schottky and ohmic electrodes may be any electrode material known in the art. Examples of such an electrode material include metals, containing Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

The Schottky and ohmic electrodes can be formed by known method such as a vacuum evaporation method or a sputtering method. For example, a Schottky electrode can be formed by laminating a layer made from Mo and a layer made from Al and patterning these layers using photolithography.

When a reverse bias is applied to the SBD in FIG. 1, a depletion layer (not shown) expands in the $n^-$-type semiconductor layer 101a, so that the SBD becomes a high-voltage SBD. When a forward bias is applied, electrons flow from the ohmic electrode 105b to the Schottky electrode 105a. As seen above, the SBD using the crystalline multilayer structure is excellent for high-voltage and large-current use and has a high switching speed, good withstand voltage characteristics, and high reliability.

Figure 2:
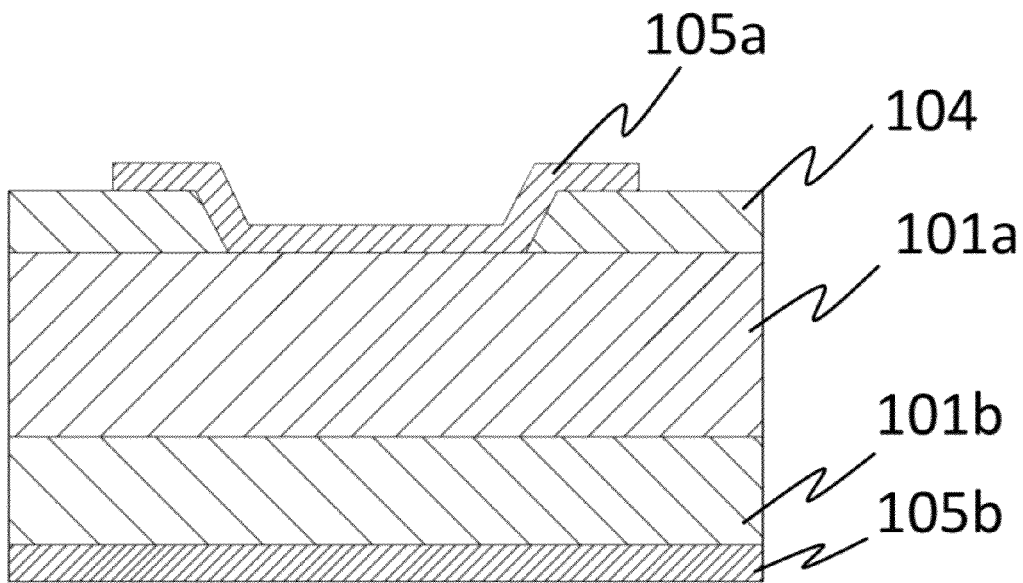
FIG. 2 is a diagram schematically showing a preferred example of a Schottky barrier diode (SBD) of the present invention.

FIG. 2 shows an example of a Schottky barrier diode (SBD) of the present invention. The SBD in FIG. 2 includes the elements of the SBD in FIG. 1, as well as an insulator layer 104. More specifically, the SBD in FIG. 2 includes the $n^-$-type semiconductor layer 101a, the $n^+$-type semiconductor layer 101b, the Schottky electrode 105a, the ohmic electrode 105b, and the insulator layer 104.

The material of the insulator layer 104 is, for example, GaO, AlGaO, InAlGaO, AlInZnGaO$_4$, AlN, Hf$_2$O$_3$, SiN, SiON, $Al_2O_3$, MgO, GdO, $SiO_2$, or $Si_3N_4$, but in the present invention, is preferably a corundum-structured material. By using a corundum-structured insulator as the insulator layer, the semiconductor properties can be favorably exhibited on the interface. The insulator layer 104 is disposed between the $n^-$-type semiconductor layer 101a and the Schottky electrode 105a. The insulator layer can be formed by known method such as a sputtering method, a vacuum evaporation method, a CVD method or the like.

The forming method, material, and the like of the Schottky and ohmic electrodes are the same as or similar to those of the SBD in FIG. 1.

The SBD in FIG. 2 has higher insulation properties and current controllability than the SBD in FIG. 1.

MESFET

Figure 3:
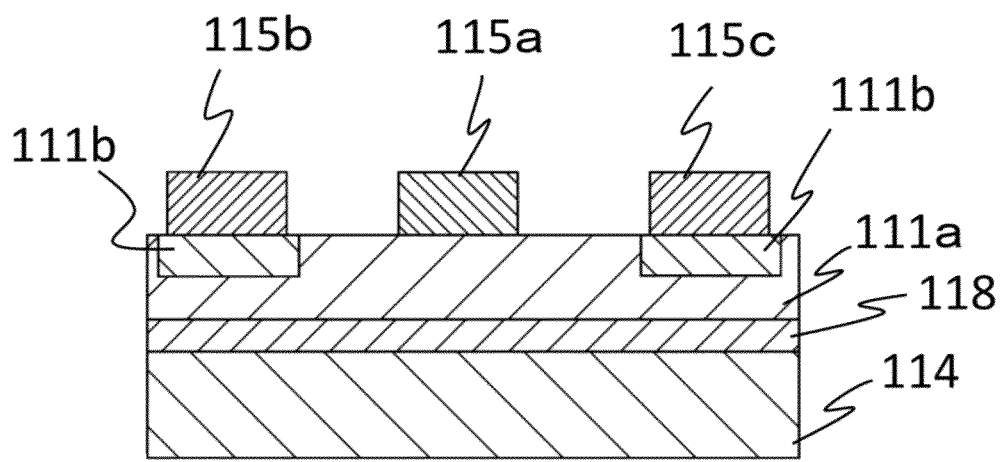
FIG. 3 is a diagram schematically showing a preferred example of a metal semiconductor field-effect transistor (MESFET) of the present invention.

FIG. 3 shows an example of a metal semiconductor field-effect transistor (MESFET) of the present invention. The MESFET in FIG. 3 includes an $n^-$-type semiconductor layer 111a, an $n^+$-type semiconductor layer 111b, a buffer layer 118, a semi-insulator layer 114, a gate electrode 115a, a source electrode 115b, and a drain electrode 115c.

The material of the gate, drain, and source electrodes may be a known electrode material. Examples of such an electrode material include metals, containing Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. The gate, drain, and source electrodes can be formed by known method such as a vacuum evaporation method, a sputtering method or the like.

The semi-insulator layer 114 only has to be formed of a semi-insulator. Examples of the semi-insulator include those containing a semi-insulator dopant such as magnesium (Mg), ruthenium (Ru), iron (Fe), beryllium (Be), cesium (Cs), strontium, or barium and those which have not been doped.

Since the MESFET in FIG. 3 has a favorable depletion layer formed under the gate electrode, there can be efficiently controlled the current flowing from the drain electrode to the source electrode.

HEMT

Figure 4:
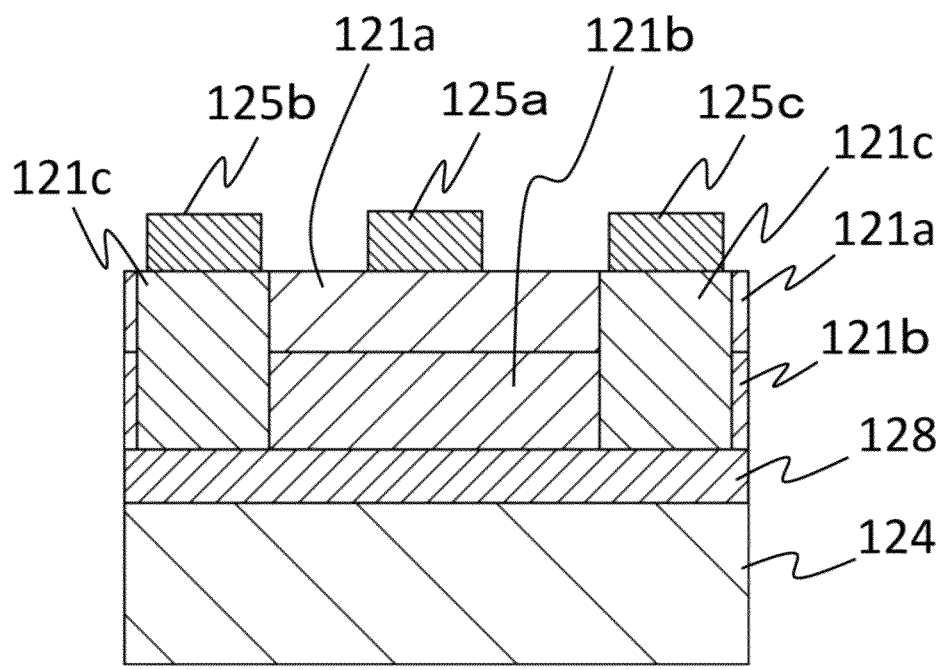
FIG. 4 is a diagram schematically showing a preferred example of a high-electron-mobility transistor (HEMT) of the present invention.

FIG. 4 shows an example of a high-electron-mobility transistor (HEMT) of the present invention. The HEMT in FIG. 4 includes a wide-band-gap n-type semiconductor layer 121a, a narrow-band-gap n-type semiconductor layer 121b, an $n^+$-type semiconductor layer 121c, a buffer layer 128, a semi-insulator layer 124, a gate electrode 125a, a source electrode 125b, and a drain electrode 125c.

The materials of the gate, drain, and source electrodes may be known electrode materials. Examples of such electrode materials include metals, containing Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. The gate, drain, and source electrodes can be formed by known method such as a vacuum evaporation method, a sputtering method or the like.

The n-type semiconductor layer under the gate electrode includes at least the wide-band-gap layer 121a and the narrow-band-gap layer 121b. The semi-insulator layer 124 only has to be formed of a semi-insulator. Examples of the semi-insulator include those containing a semi-insulator dopant such as ruthenium (Ru) or iron (Fe) and those which have not been doped.

Since the HEMT in FIG. 4 has a favorable depletion layer formed under the gate electrode, there can be efficiently controlled the current flowing from the drain electrode to the source electrode. Further, if this HEMT has a recess structure, the normally-off characteristics can be achieved.

MOSFET

Figure 5:
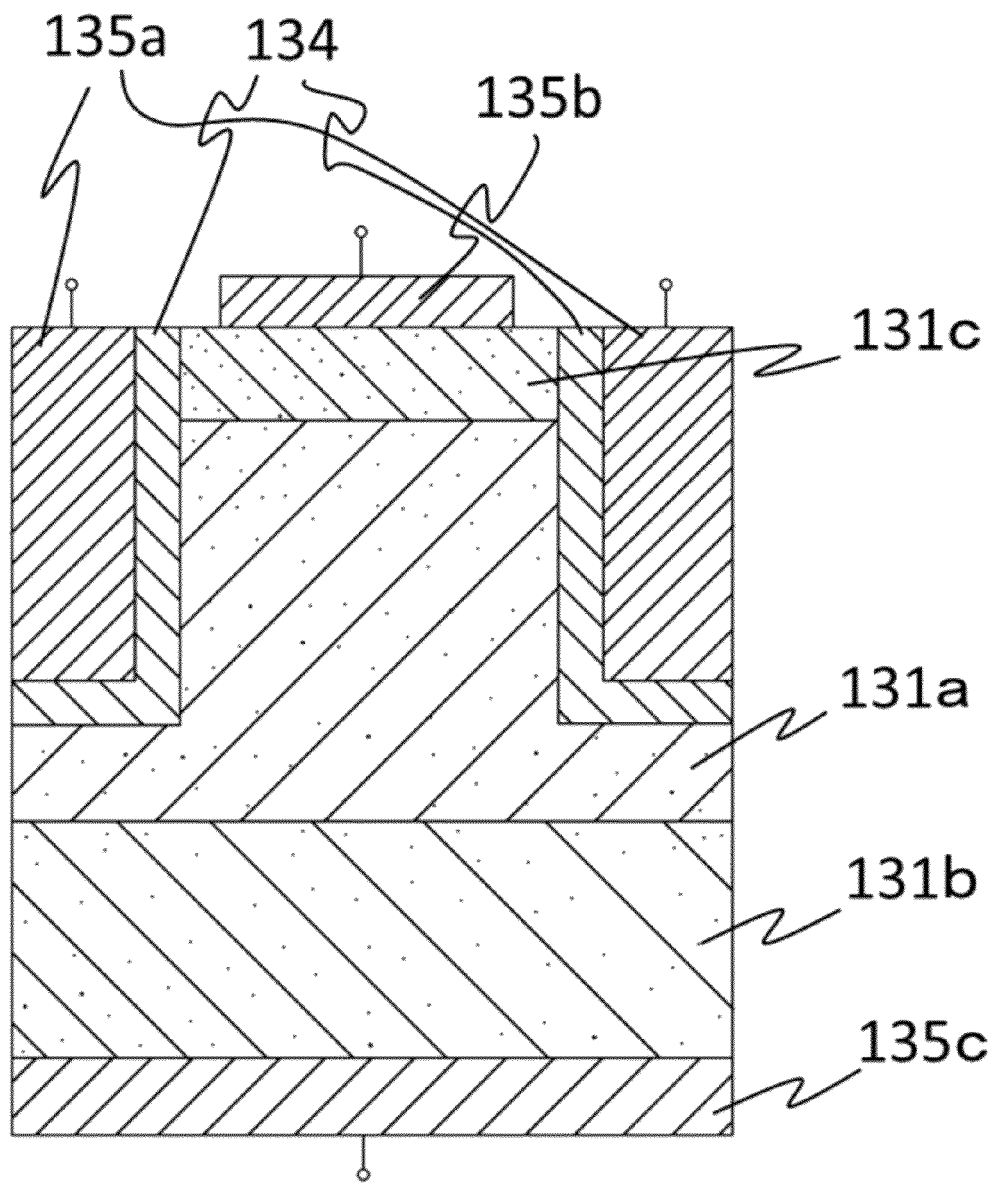
FIG. 5 is a diagram schematically showing a preferred example of a metal oxide semiconductor field-effect transistor (MOSFET) of the present invention.

FIG. 5 shows an example of a MOSFET which is a semiconductor device of the present invention. The MOSFET in FIG. 5 is a trench MOSFET and includes an $n^-$-type semiconductor layer 131a, $n^+$-type semiconductor layers 131b and 131 c, a gate insulating film 134, a gate electrode 135a, a source electrode 135b, and a drain electrode 135c.

An $n^+$-type semiconductor layer 131b having a thickness of, e.g., 100 nm to 100 μm is formed on the drain electrode 135c; an $n^-$-type semiconductor layer 131a having a thickness of, e.g., 100 nm to 100 μm is formed on the $n^+$-type semiconductor layer 131b; the $n^+$-type semiconductor layer 131c is formed on the $n^-$-type semiconductor layer 131a; and the source electrode 135b is formed on the $n^+$-type semiconductor layer 131c.

Multiple trenches are formed so as to penetrate through the $n^+$-type semiconductor layer 131c and halfway through the $n^-$-type semiconductor layer 131a in the depth direction. The gate insulating film 134 having a thickness of, e.g., 10 nm to 1 μm and the gate electrode 135a are embedded in the trenches in this order.

In FIG. 5, when a voltage is applied between the source electrode 135b and the drain electrode 135c and when a positive voltage is applied between the gate electrode 135a and the source electrode 135b, a channel layer is formed on a side of the $n^-$-type semiconductor layer 131a, and electrons are injected into the $n^-$-type semiconductor layer 131a. Thus, the MOSFET is turned on. On the other hand, when the voltage of the gate electrode is set to 0 V, a formation of a channel layer is stopped, and the $n^-$-type semiconductor layer 131a is filled with the depletion layer. Thus, the MOSFET is turned off.

FIGS. 6A and 6B show a part of a process of manufacturing the MOSFET in FIG. 5. For example, etching masks are disposed in predetermined regions of an $n^-$-type semiconductor layer 131a and an $n^+$-type semiconductor layer 131c of a multilayer body as shown in FIG. 6A. Then, anisotropic etching is performed by reactive ion etching or the like to form trenches which penetrate through the $n^+$-type semiconductor layer 131c and halfway through the $n^-$-type semiconductor layer 131a in the depth direction, as shown in FIG. 6B. Then, a gate insulating film 134 having a thickness of, e.g., 50 nm to 1 μm is formed on side and bottom surfaces of the trenches using known method such as a thermal oxidation method, a vacuum evaporation method, a sputtering method, a CVD method or the like. Then, a gate electrode material such as polysilicon is formed with a thickness smaller than or equal to that of the $n^-$-type semiconductor layer 131a in the trenches by a CVD method, a vacuum evaporation method, a sputtering method, or the like.

Then, a source electrode 135b and a drain electrode 135c are formed on the $n^+$-type semiconductor layer 131c and $n^+$-type semiconductor layer 131b, respectively, by known method such as a vacuum evaporation method, a sputtering method, or a CVD method. In this way, a power MOSFET is manufactured. The materials of the source and drain electrodes may be known electrode materials. Examples of such electrode materials include metals, containing Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

The MOSFET thus formed has better withstand voltage characteristics than conventional trench MOSFETs. While an example of a vertical trench MOSFET is shown in FIG. 5, the present invention is not limited to this example and is applicable to various forms of MOSFETs. For example, the trenches in FIG. 5 may be dug to a depth such that they reach the bottom of the n⁻-type semiconductor layer 131a, to reduce the series resistance. Further, an example of a lateral MOSFET is shown in FIG. 7. The MOSFET in FIG. 7 includes an n⁻-type semiconductor layer 131a, a first n⁺-type semiconductor layer 131b, a second n⁺-type semiconductor layer 131c, a gate insulating film 134, a gate electrode 135a, a source electrode 135b, a drain electrode 135c, a buffer layer 138, and a semi-insulator layer 139. As shown in FIG. 7, the n⁺-type semiconductor layers are embedded in the n⁻-type semiconductor layer, so that the current can be passed more favorably.

SIT

FIG. 8 shows an example of an SIT which is a semiconductor device of the present invention. The SIT in FIG. 8 includes an n⁻-type semiconductor layer 141a, n⁺-type semiconductor layers 141b and 141c, a gate electrode 145a, a source electrode 145b, and a drain electrode 145c.

The n⁺-type semiconductor layer 141b having a thickness of, e.g., 100 nm to 100 μm is formed on the drain electrode 145c; the n⁻-type semiconductor layer 141a having a thickness of, e.g., 100 nm to 100 μm is formed on the n+-type semiconductor layer 141b; the n⁺-type semiconductor layer 141c is formed on the n⁻-type semiconductor layer 141a; and the source electrode 145b is formed on the n⁺-type semiconductor layer 141c.

Multiple trenches are formed so as to penetrate through the n⁺-type semiconductor layer 141c and halfway through the n⁻-type semiconductor layer 141a in the depth direction. The gate electrode 145a is formed on the n⁻-type semiconductor layer 141a in the trenches.

In FIG. 8, when a voltage is applied between the source electrode 145b and the drain electrode 145c and thus a positive voltage is supplied to the gate electrode 145a through the source electrode 145b, a channel layer is formed within the n⁻-type semiconductor layer 141a, and electrons are injected into the n⁻-type semiconductor layer 141a. Thus, the SIT is turned on. On the other hand, when the voltage of the gate electrode is set to 0 V, a formation of a channel layer is stopped, and the n⁻-type semiconductor layer 141a is filled with the depletion layer. Thus, the SIT is turned off.

FIGS. 9A and 9B show a part of a process of manufacturing the SIT in FIG. 8. For example, etching masks are disposed in predetermined regions of an n⁻-type semiconductor layer 141a and an n⁺-type semiconductor layer 141c of a multilayer body as shown in FIG. 9A; anisotropic etching is performed using reactive ion etching or the like to form trenches which penetrate through the n⁺-type semiconductor layer 141c and halfway through the n⁻-type semiconductor layer 141a in the depth direction, as shown in FIG. 9B. Then, a gate electrode material such as polysilicon is formed with a thickness smaller than or equal to that of the n⁻-type semiconductor layer 141a in the trenches by a CVD method, a vacuum evaporation method, a sputtering method, or the like. Then, a source electrode 145b and drain electrode 145c are formed on the n⁺-type semiconductor layer 141c and n⁺-type semiconductor layer 141b, respectively, by known means such as vacuum evaporation, sputtering, CVD, or the like. In this way, a SIT is manufactured. The materials of the source and drain electrodes may be known electrode materials. Examples of such electrode materials include metals, containing Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

Examples of the semiconductor device using no p-type semiconductor have been described above. However, the present invention is not limited to these examples, and a p-type semiconductor may be used in a semiconductor device. FIGS. 10 to 16 show examples of a semiconductor device using a p-type semiconductor. These semiconductor devices can be manufactured in manners similar to those of the above examples. Note that the p-type semiconductor may be one whose material is the same as that of an n-type semiconductor and which includes a p-type dopant or may be one whose material differs from that of an n-type semiconductor.

Figure 10:
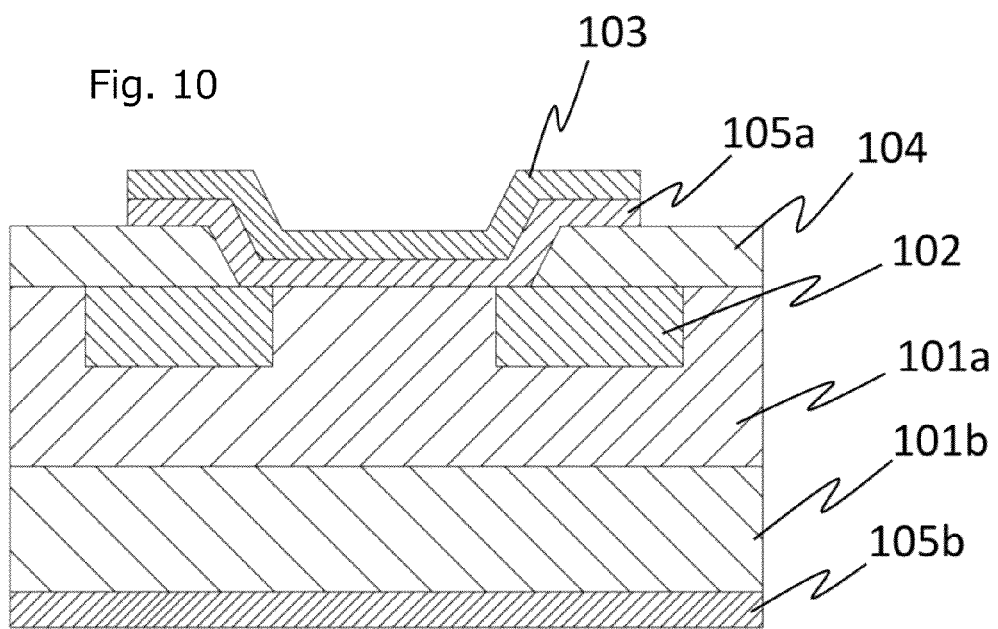
FIG. 10 is a diagram schematically showing a preferred example of a Schottky barrier diode (SBD) of the present invention.
Figure 11:
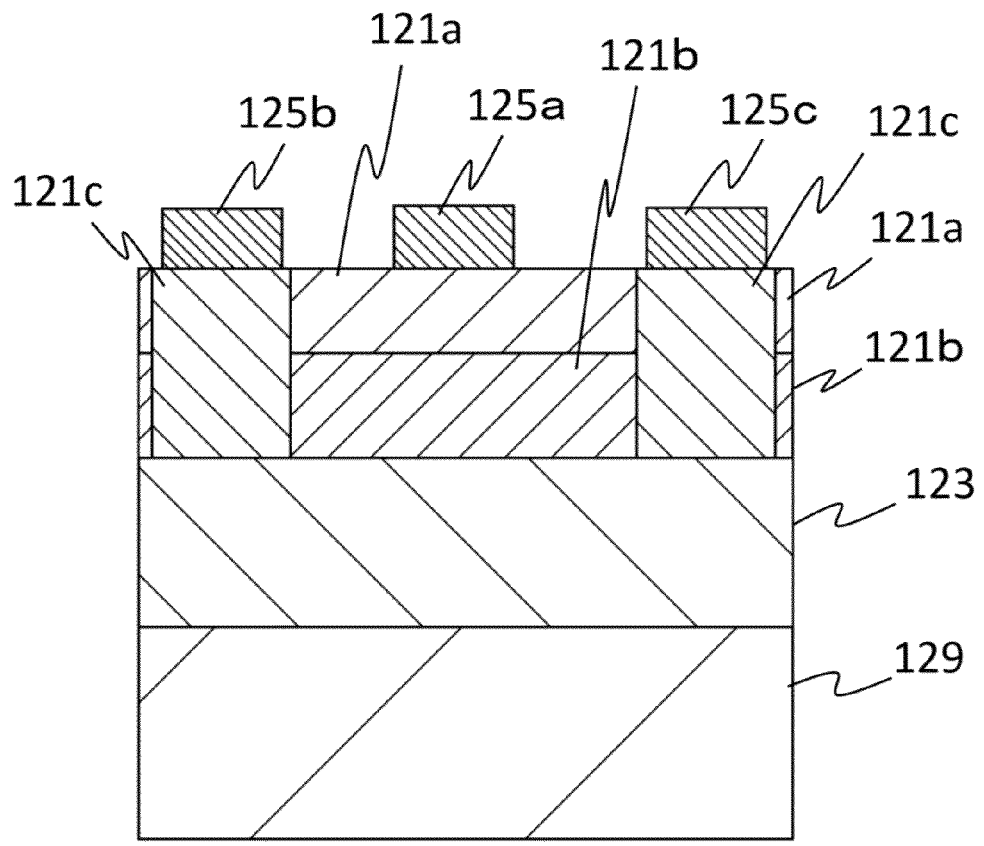
FIG. 11 is a diagram schematically showing a preferred example of a high-electron-mobility transistor (HEMT) of the present invention.

FIG. 10 shows a preferred example of a Schottky barrier diode (SBD) including an n⁻-type semiconductor layer 101a, an n⁺-type semiconductor layer 101b, a p-type semiconductor layer 102, a metal layer 103, an insulator layer 104, a Schottky electrode 105a, and an ohmic electrode 105b. The metal layer 103 formed from, for example, a metal such as Al and covers the Schottky electrode 105a. FIG. 11 shows an preferred example of a high-electron-mobility transistor (HEMT) including a wide-band-gap n-type semiconductor layer 121a, a narrow-band-gap n-type semiconductor layer 121b, an n⁺-type semiconductor layer 121c, a p-type semiconductor layer 123, a gate electrode 125a, a source electrode 125b, a drain electrode 125c, and a substrate 129.

Figure 12:
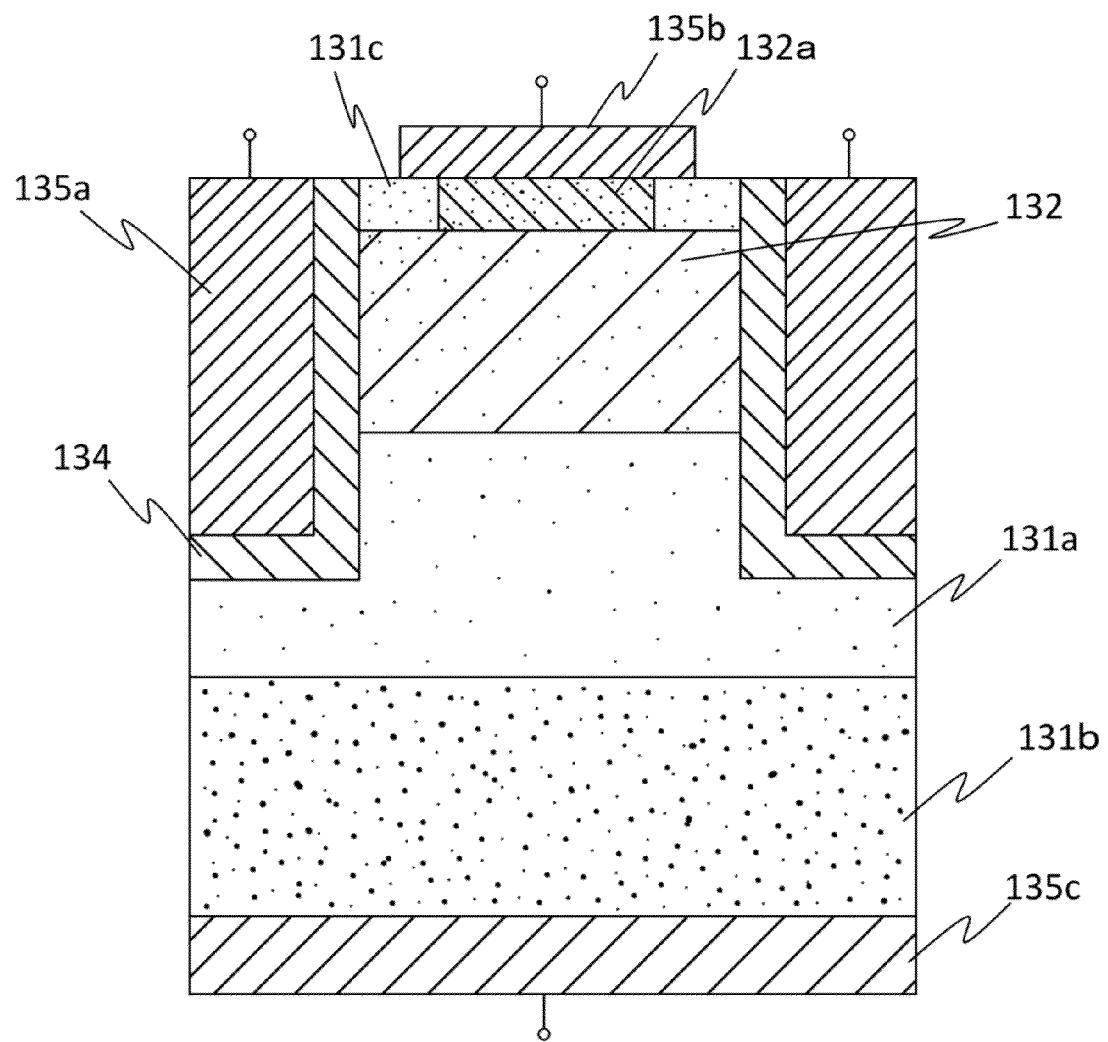
FIG. 12 is a diagram schematically showing a preferred example of a metal oxide semiconductor field-effect transistor (MOSFET) of the present invention.
Figure 13:
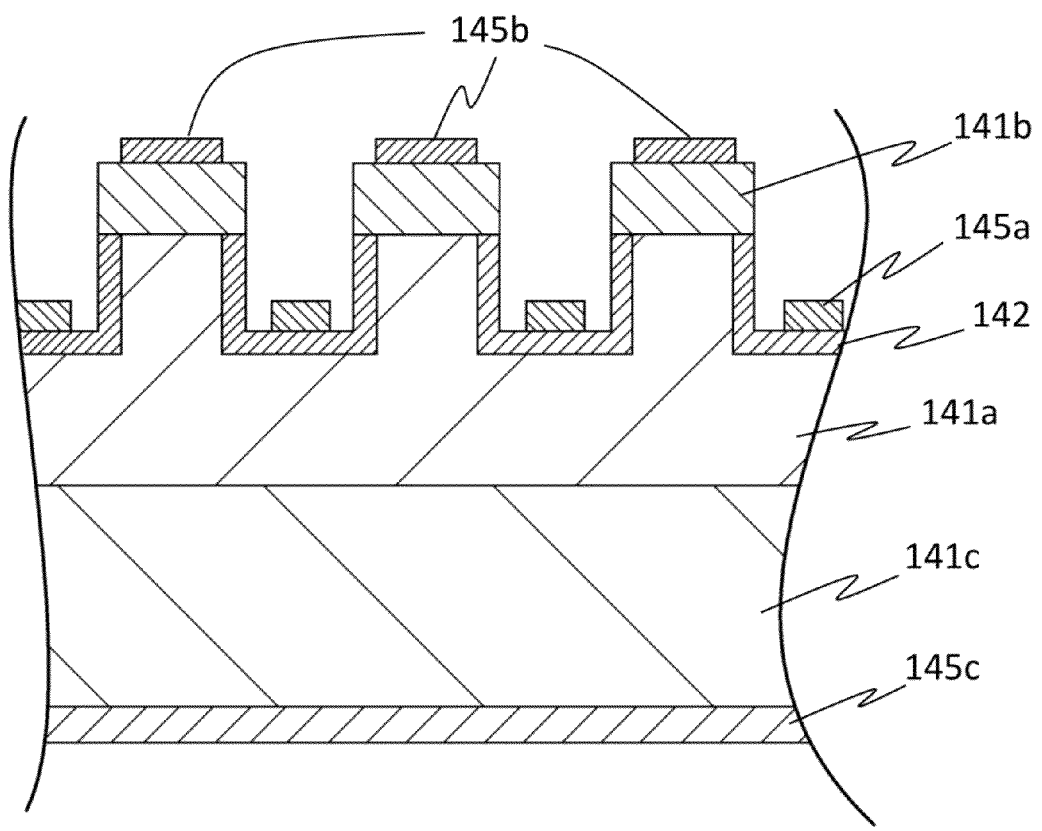
FIG. 13 is a diagram schematically showing a preferred example of a junction field-effect transistor (JFET) of the present invention.
Figure 14:
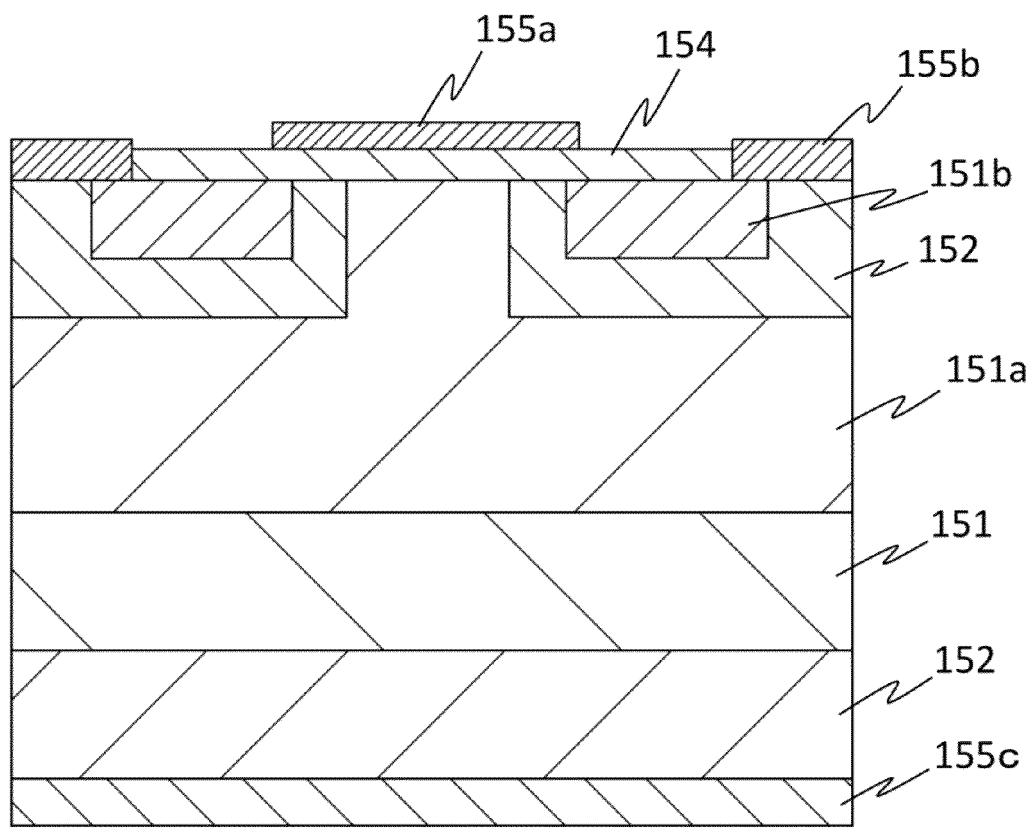
FIG. 14 is a diagram schematically showing a preferred example of an insulated gate bipolar transistor (IGBT) of the present invention.

FIG. 12 shows a preferred example of a metal oxide semiconductor field-effect transistor (MOSFET) including an n⁻-type semiconductor layer 131a, a first n⁺-type semiconductor layer 131b, a second n⁺-type semiconductor layer 131c, a p-type semiconductor layer 132, a p⁺-type semiconductor layer 132a, a gate insulating film 134, a gate electrode 135a, a source electrode 135b, and a drain electrode 135c. Note that the p⁺-type semiconductor layer 132a may be a p-type semiconductor layer or may be the same as the p-type semiconductor layer 132. FIG. 13 shows a preferred example of a junction field-effect transistor (JFET) including an n⁻-type semiconductor layer 141a, a first n⁺-type semiconductor layer 141b, a second n⁺-type semiconductor layer 141c, a p-type semiconductor layer 142, a gate electrode 145a, a source electrode 145b, and a drain electrode 145c. FIG. 14 shows an preferred example of an insulated gate bipolar transistor (IGBT) including an n-type semiconductor layer 151, n⁻-type semiconductor layer 151a, n⁺-type semiconductor layer 151b, a p-type semiconductor layer 152, a gate insulating film 154, a gate electrode 155a, an emitter electrode 155b, and a collector electrode 155c.

LED

Figure 15:
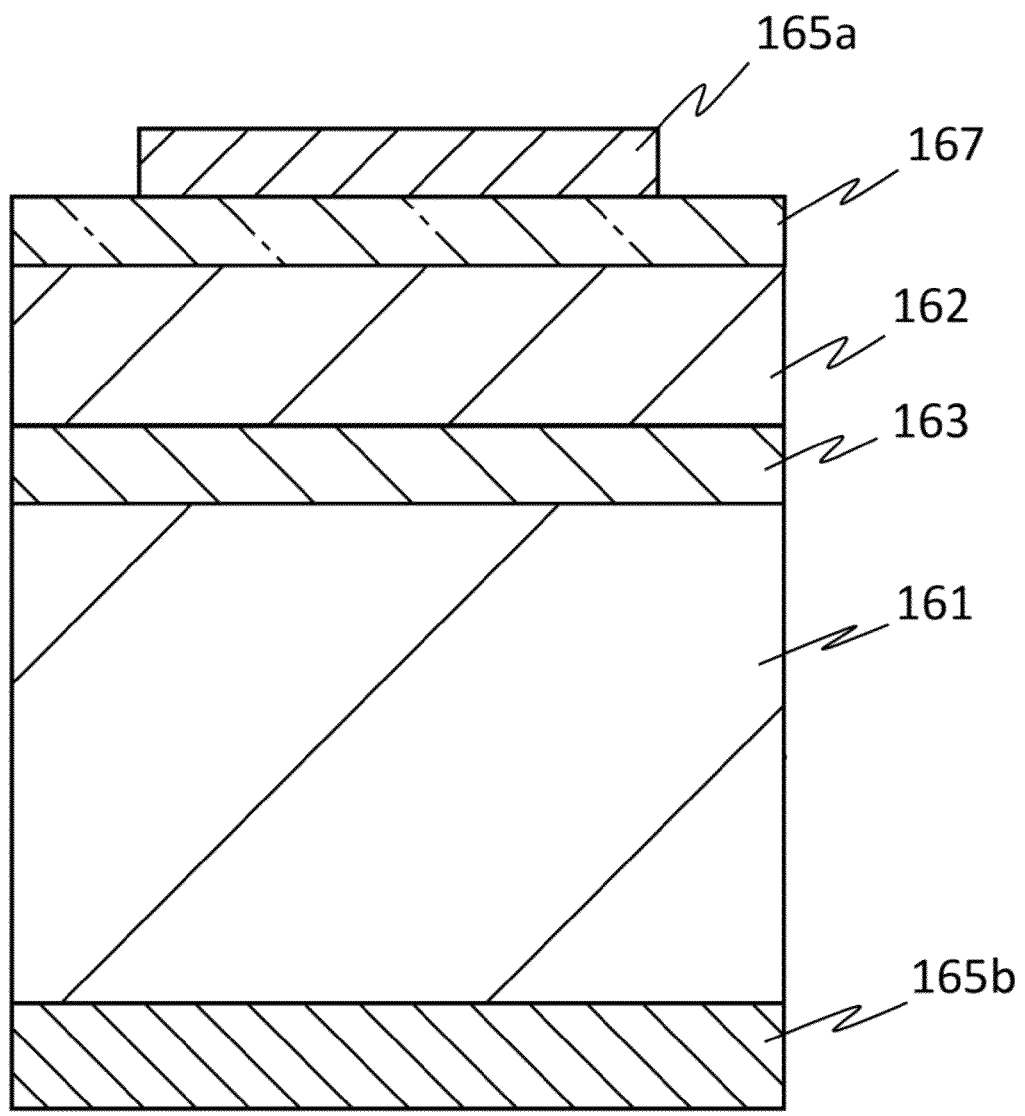
FIG. 15 is a diagram schematically showing a preferred example of a light-emitting diode (LED) of the present invention.

FIG. 15 shows an example of a light-emitting diode (LED) which is a semiconductor device of the present invention. In the semiconductor light-emitting device in FIG. 15, an n-type semiconductor layer 161 is disposed on a second electrode 165b, and a light-emitting layer 163 is laminated on the n-type semiconductor layer 161. A p-type semiconductor layer 162 is laminated on the light-emitting layer 163. A translucent electrode 167 configured to transmit light emitted by the light-emitting layer 163 is disposed on the p-type semiconductor layer 162. A first electrode 165a is laminated on the translucent electrode 167. Note that the semiconductor light-emitting device in FIG. 15 may be covered by a protective layer except for the electrodes thereof.

Examples of the material of the translucent electrode include conductive oxide materials containing indium (In) or titanium (Ti). More specific examples include $In_2O_3$, ZnO, $SnO_2$, $Ga_2O_3$, $TiO_2$, $CeO_2$, mixed crystals of two or more thereof, and doped ones of these materials. The translucent electrode can be formed from the above materials by known means such as sputtering. The formed translucent electrode may be thermally annealed to provide it with transparency.

In the semiconductor light-emitting device in FIG. 15, when a current is passed through the p-type semiconductor layer 162, the light-emitting layer 163, and the n-type semiconductor layer 161 while using the first electrode 165a as a positive electrode and the second electrode 165b as a negative electrode, the light-emitting layer 163 emits light.

Examples of the material of the first electrode 165a and the second electrode 165b include metals, containing Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. The method for forming the electrode is not particularly limited, and it is possible to form using any film-forming method and, for example, may be formed on the substrate using a method which is appropriately selected from among wet methods such as printing, spraying, and coating, physical methods such as vacuum evaporation, sputtering, and ion plating, chemical methods such as CVD and plasma CVD, and the like considering the suitability for the electrode material.

Figure 16:
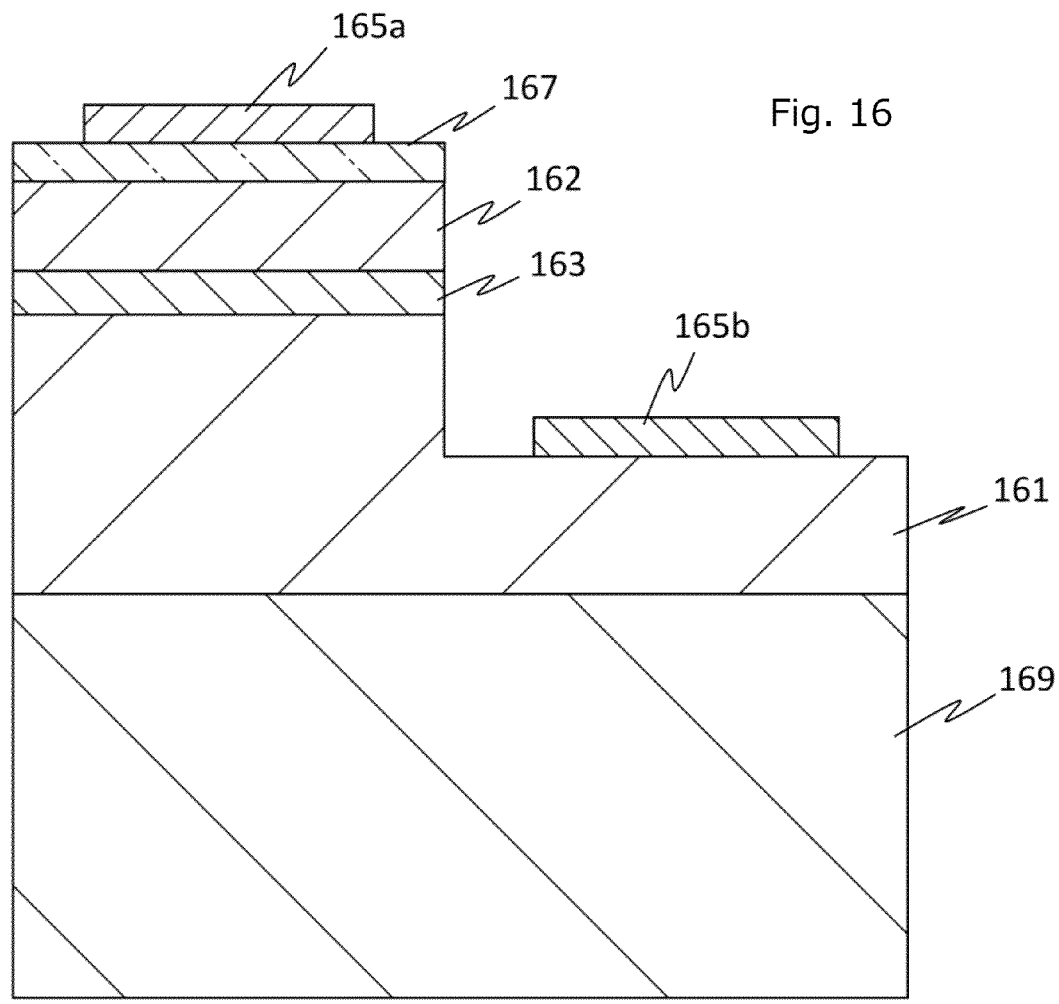
FIG. 16 is a diagram schematically showing a preferred example of a light-emitting diode (LED) of the present invention.

FIG. 16 shows another form of light-emitting device. In the light-emitting device in FIG. 16, an n-type semiconductor layer 161 is laminated on a substrate 169, and a second electrode 165b is laminated on a part of a surface of the n-type semiconductor layer 161 exposed by cutting off respective parts of a p-type semiconductor layer 162, a light-emitting layer 163, and the n-type semiconductor layer 161.

EXAMPLE

Crystalline Multilayer Structure

Described below is an Example of the present invention.
1. CVD Apparatus

Figure 17:
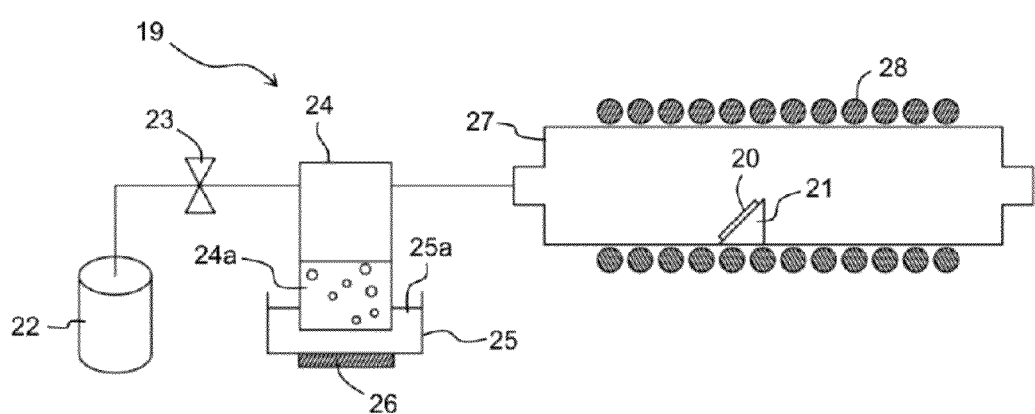
FIG. 17 is a configuration diagram of a mist CVD apparatus used in an Example of the present invention.

First, referring to FIG. 17, a CVD apparatus 19 used in this Example will be described. The CVD apparatus 19 includes a sample stage 21 for placing a sample 20 on which films are to be formed, such as a base substrate, a carrier-gas source 22 for providing a carrier gas, a flow rate control valve 23 for controlling the flow rate of the carrier gas sent from the carrier-gas source 22, a mist source 24 containing a raw-material solution 24a, a container 25 containing water 25a, an ultrasonic transducer 26 attached to the bottom of the container 25, a film forming chamber 27 formed of a 40-mm-inner-diameter quartz tube, and a heater 28 disposed around the film forming chamber 27. The sample stage 21 is formed of quartz, and the surface thereof for placing the sample 20 is inclined from the horizontal plane. By forming both the film forming chamber 27 and sample stage 21 from quartz, entry of apparatus-derived impurities into films formed on the sample 20 is reduced.

2. Preparation of Raw-Material Solution
Condition 1

An aqueous solution was prepared from gallium bromide and germanium oxide such that the atomic ratio of germanium to gallium was 1:0.05. Then, a 48% solution of hydrobromic acid was added to the aqueous solution at a volume percent of 10%. In condition 1, the concentration of germanium oxide was set to $5.0 \times 10^{-3}$ mol/L.

Condition 2

An aqueous solution was prepared such that the molar ratio among gallium bromide, aluminum bromide, and germanium oxide was 100:200:0.04. Then, a 48% solution of hydrobromic acid was added to the aqueous solution at a volume percent of 10%. In condition 2, the concentration of germanium oxide was set to $4.0 \times 10^{-5}$ mol/L.

The raw-material solution 24a thus prepared was injected into the mist source 24.

3. Preparation for Film Forming

Subsequently, a 10 mm-side square, 600 μm-thick c-plane sapphire substrate was placed as the sample 20 on the sample stage 21, and the heater 28 was activated to raise the temperature in the film forming chamber 27 to 500° C. Then, the flow rate control valve 23 was opened to send the carrier gas from the carrier-gas source 22 into the film forming chamber 27. After the carrier gas sufficiently substituted for the atmosphere in the film forming chamber 27, the flow rate of the carrier gas was adjusted to 5 L/min. An oxygen gas was used as the carrier gas.

4. Formation of Thin Film

Subsequently, the ultrasonic transducer 26 was vibrated at 2.4 MHz so that the vibration was propagated to the raw-material solution 24a through the water 25a. Thus, the raw-material solution 24a was atomized into raw-material fine particles.

The raw-material fine particles were carried into the film forming chamber 27 by the carrier gas and then the thin film was formed by a CVD reaction on the film forming surface of the sample 20. Under condition 2, the sample thin film formed under condition 1 was annealed using a mixed gas of hydrogen and nitrogen (mixture ratio of 5:95) at 800° C. for 90 minutes.

5. Evaluation

The phases of the respective thin films formed under conditions 1 and 2 were identified. The identification was made by 2θ/ω scanning each thin film at angles of 15 to 95 degrees using an XRD diffractometer for thin films. Then, measurements were made using CuKα rays. As a result, the thin film formed from the raw-material solution of condition 1 was found to be an α-$Ga_2O_3$ thin film. On the other hand, while the thin film formed from the raw-material solution of condition 2 was an α-$Ga_2O_3$ thin film before annealed, it was believed to have been transformed into a microcrystalline or an amorphous $Ga_2O_3$ thin film by annealing.

To evaluate the electrical properties of the thin films obtained, a Hall effect of each thin film was measured using the van der pauw method. The measurements were made at room temperature and at an applied magnetic field frequency of 50 mHz. The carrier concentrations and mobilities obtained are shown in Table 1.

Table 1 indicates that both the thin films of conditions 1 and 2 were provided with electrical conductivity. Note that for condition 2, the annealed thin film was measured.

TABLE 1

|  | Condition 1 | Condition 2 |
|---|---|---|
| Hall coefficient [$cm^3$/C.] | 1.22E+00 | 6.19E−01 |
| Carrier concentration [1/$cm^3$] | 5.10E+18 | 1.01E+19 |
| Sheet carrier concentration [1/$cm^2$] | 2.55E+14 | 5.04E+14 |
| Mobility [$cm^2$/V*s] | 2.60E−01 | 3.26E+00 |

6. Evaluation of Doping Success Rate

By the way, when multiple samples were formed under the same conditions and subjected to the above-mentioned Hall effect measurement, measurement values were obtained from some samples, but no measurement value was obtained from the other samples because the resistance of those samples were too high. To evaluate these samples simply, a voltage of 100V was applied to each sample using a 0.2 cm$^2$-titanium electrode with an inter-terminal distance of 200 μm and then the current value was measured to calculate the resistance value. The resistance value significantly varied among even the samples formed under the same condition.

Described below are the results of experiments where tin was used as a dopant and experiments where germanium was used as a dopant. In the tin-doped experiments, a solution obtained by dissolving tin (II) chloride dihydrate, gallium acetylacetonate, and hydrochloric acid in water was used as a raw material. In the germanium-doped experiments, on the other hand, the condition was the same as that in condition 1 except that the amount of germanium oxide was changed. Raw-material solutions containing different amounts of tin or germanium were prepared and then films were formed from the respective raw-material solutions at 500° C. and at a flow rate of 5 L/min using oxygen as a carrier gas for 30 minutes.

Table 2 blow shows the results. In Table 2, films whose resistance value was 1.0E+10Ω or less are rated as "low resistance," and films whose resistance value was more than 1.0E+10Ω are rated as "high resistance." The "in-solution dopant content" refers to the molar percentage of germanium to gallium in the raw-material solution. The thin films doped with tin at high concentrations of 1% or more exhibited no electrical conductivity. This means that a high-concentration doped layer for use in ohmic connection with the electrode is difficult to form. Accordingly, these thin films are problematic in terms of industrial applications. On the other hand, among the samples doped with germanium, more than half of the samples exhibited electrical conductivity even when the doping concentration was as high as 1% or higher.

TABLE 2

| In-solution dopant content (%) | Sn | | | Ge | | |
|---|---|---|---|---|---|---|
| | Low resistance | High resistance | Experiment count | Low resistance | High resistance | Experiment count |
| <0.008 | 0 | 5 | 5 | 1 | 4 | 5 |
| 0.008≤ and <0.04 | 0 | 2 | 2 | 1 | 1 | 2 |
| 0.04≤ and <0.2 | 1 | 3 | 4 | 3 | 1 | 4 |
| 0.2≤ and <1 | 2 | 2 | 4 | 3 | 1 | 4 |
| 1≤ and <10 | 0 | 5 | 5 | 3 | 2 | 5 |
| 10≤ | 0 | 2 | 2 | 2 | 0 | 2 |
| Total | 3 | 19 | 22 | 13 | 9 | 22 |
| Success rate | | | 14% | | | 59% |

7. Control of Dopant Concentration

Raw-material solutions were prepared from gallium bromide and germanium oxide such that the atomic ratio of germanium to gallium is 1E-7, 1E-6, 8E-5, 4E-4, 2E-3, 1E-2, 2E-1, and 8E-1, respectively. Then, a 48% solution of hydrobromic acid was added to each raw-material solution at a volume percent of 10%. Then, thin films were formed from these raw-material solutions under the above conditions, and the concentration of the impurity was analyzed quantitatively using an SIMS under the following conditions: incident ion species oxygen; and output 3 kV, 200 nA. The results are shown in FIG. 18. FIG. 18 indicates that the in-solution dopant content and the in-film dopant content have a correlation and that by adjusting the in-solution dopant content, the dopant content of a thin film to be formed can be easily controlled.

8. Electrical Thermotolerance (Data Indicating that Addition of Germanium Makes the Resistance Less Likely to Increase when Heated)

A Ge-doped thin film sample was formed from a raw-material solution having a Ge concentration of 0.04% (this thin film will be referred to as the Example sample) in a manner similar to condition 1. Further, a Sn-doped thin film sample was formed from a raw-material solution having a Sn concentration of 0.04% using a film forming method disclosed in Non-Patent Literature 3 (Electrical Conductive Corundum-Structured α-Ga$_2$O$_3$ Thin Films on Sapphire with Tin-Doping Grown by Spray-Assisted Mist Chemical Vapor Deposition, *Japanese Journal of Applied Physics* 51 (2012) 070203) (this thin film will be referred to as the reference sample). These samples were annealed using a mixed gas of hydrogen and nitrogen (mixture ratio: 5:95) at 450° C. for 5 minutes. The resistance values measured before and after annealing are shown in FIG. 19. FIG. 19 indicates that while the Sn-doped thin film increased in the resistance value, the Ge-doped thin film decreased in resistance value. Specifically, when the Sn-doped gallium oxide thin film was annealed in the formation of an ohmic electrode, it increased in the resistance; the Ge-doped gallium oxide thin film avoided increasing in resistance. Accordingly, the latter seems to be advantageous in achieving an ohmic contact.

9. Low-Concentration Germanium-Doped Gallium Oxide

Condition 3—Ge doping

An aqueous solution was prepared such that the molar ratio among gallium bromide and germanium oxide was 100:5. Then, a 48% solution of hydrobromic acid was added to the aqueous solution at a volume percent of 10%. The concentration of germanium oxide was set to 5.0×10$^{-3}$ mol/L. Then, a film was formed from the aqueous solution at 500° C. and at a flow rate of 5 L/min using nitrogen as a carrier gas for 30 minutes.

Condition 4—Sn Doping

An aqueous solution was prepared such that the molar ratio among gallium bromide and tin bromide was 100:1. Then, a 48% solution of hydrobromic acid was added to the aqueous solution at a volume percent of 10%. The concentration of tin bromide was set to 1.0×10$^{-3}$ mol/L. Then, a film was formed from the aqueous solution at 500° C. and at a flow rate of 5 L/min using nitrogen as a carrier gas for 30 minutes.

The thin film samples formed under conditions 3 and 4 were SIMS measured using ADEPT-1010 manufactured by ULVAC PHI under the following conditions: incident ion species Cs; and output 3 kV, 100 nA. With respect to the SIMS measurement data, the signal strength of each ion species was divided by the signal strength of oxygen (18O), and the value obtained was averaged in the depth direction. The values obtained are shown in Table 3. It can be said that as the signal strength becomes weaker, the amount of impurity becomes smaller.

Table 3 indicates that while the reference sample of condition 4 contained large amounts of carbon and chloride as contamination, the Example sample of condition 3 was substantially free of carbon or chloride contamination, as well as had an effect of suppressing hydrogen or nitride contamination.

TABLE 3

| Measured element | Contamination suppressed | Relative signal strength | |
|---|---|---|---|
| | | Example sample | Reference sample |
| 1.2H | ○ | 1.2E−03 | 3.2E−03 |
| 12C | ○ | 1.2E−04 | 3.0E−03 |
| 14N | ○ | 1.1E−05 | 2.0E−05 |
| 18O | ○ | 1.0E+00 | 1.0E+00 |
| 35Cl | ○ | 2.5E−04 | 3.6E−03 |
| 79Br | Δ | 1.1E−04 | 1.8E−05 |

Condition 5 μSilicon Doping

An aqueous solution was prepared such that the molar ratio among gallium bromide, and tetraethyl orthosilicate was 100:1. Then, a 48% solution of hydrobromic acid was added to the aqueous solution at a volume percent of 10%. The concentration of tetraethyl orthosilicate was set to $1.0\times10^{-3}$ mol/L. Then, a film was formed from the aqueous solution at 500° C. and at a flow rate of 5 L/min using nitrogen as a carrier gas for 30 minutes. As a result, this sample was found to exhibit performance equivalent to that of the germanium-doped Example sample.

Condition 6—Titanium Doping

An aqueous solution was prepared such that the molar ratio among gallium bromide and titanium acetylacetonate was 100:1. Then, a 48% solution of hydrobromic acid was added to the aqueous solution at a volume percent of 10%. The concentration of titanium acetylacetonate was set to $1.0\times10^{-3}$ mol/L. Then, a film was formed from the aqueous solution at 500° C. and at a flow rate of 5 L/min using nitrogen as a carrier gas for 30 minutes. As a result, this sample was found to exhibit performance equivalent to that of the germanium-containing Example sample and to have better electrical properties than the Sn-doped reference sample.

Condition 7—Niobium Doping

An aqueous solution was prepared such that the molar ratio among gallium bromide and niobium bromide was 100:1. Then, a 48% solution of hydrobromic acid was added to the aqueous solution at a volume percent of 10%. The concentration of niobium bromide was set to $1.0\times10^{-3}$ mol/L. Then, a film was formed from the aqueous solution at 500° C. and at a flow rate of 5 L/min using nitrogen as a carrier gas for 30 minutes. As a result, this sample was found to exhibit performance equivalent to that of the germanium-doped Example sample and to have better electrical properties than the Sn-doped reference sample.

Condition 8—Zirconium Doping

An aqueous solution was prepared such that the molar ratio among gallium bromide and zirconium tetrachloride was 100:1. Then, a 48% solution of hydrobromic acid was added to the aqueous solution at a volume percent of 10%. The concentration of zirconium tetrachloride was set to $1.0\times10^{-3}$ mol/L. Then, a film was formed from the aqueous solution at 500° C. and at a flow rate of 5 L/min using nitrogen as a carrier gas for 30 minutes. As a result, this sample was found to exhibit performance equivalent to that of the germanium-doped Example sample and to have better electrical properties than the Sn-doped reference sample.

Condition 9—Vanadium Doping

An aqueous solution was prepared such that the molar ratio among gallium bromide and vanadium bromide was 100:1. Then, a 48% solution of hydrobromic acid was added to the aqueous solution at a volume percent of 10%. The concentration of vanadium bromide was set to $1.0\times10^{-3}$ mol/L. Then, a film was formed from the aqueous solution at 500° C. and at a flow rate of 5 L/min using nitrogen as a carrier gas for 30 minutes. As a result, this sample was found to exhibit performance equivalent to that of the germanium-doped Example sample and to have better electrical properties than the Sn-doped reference sample.

Condition 10—Indium Oxide Thin Film

A crystalline multilayer structure was formed under the following conditions: amount of indium 0.025 mol % L; amount of dopant 1 mol % relative to indium; carrier gas $N_2$; temperature 500° C.; film-forming time 20 minutes; and other conditions the same as condition 1.

Condition 11—SBD

Figure 20:
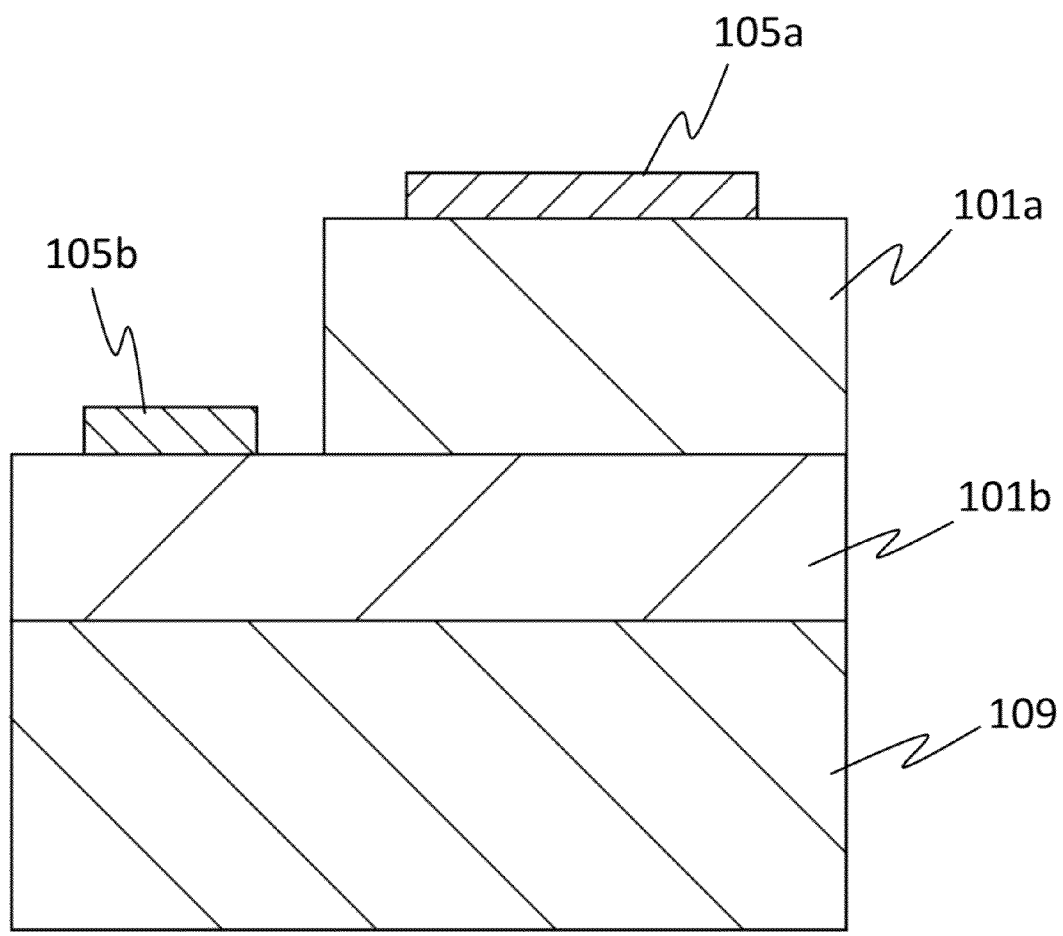
FIG. 20 is a diagram showing the structure of a Schottky barrier diode (SBD) in the Example.

A germanium-doped $\alpha$-$Ga_2O_3$ thin film was formed as an $n^+$-type semiconductor layer on a c-plane sapphire substrate under the same condition as Condition 1, except that the concentration of the germanium oxide was set to $1.0\times10^{-3}$ mol/L in place of $5.0\times10^{-3}$ mol/L. Then, a non-doped $\alpha$-$Ga_2O_3$ thin film was formed as an $n^-$-type semiconductor layer on the $n^+$-type semiconductor layer unintentionally. This $n^-$-type semiconductor layer was formed as described above except that the $n^-$-type semiconductor layer was not doped. Then, as shown in FIG. 20, after the $n^-$-type semiconductor layer was partially etched, an ohmic electrode consisting of Ti and a Schottky electrode consisting of Pt were formed on the $n^+$-type semiconductor layer and $n^-$-type semiconductor layer, respectively, by sputtering, thereby forming an SBD.

Figure 21:
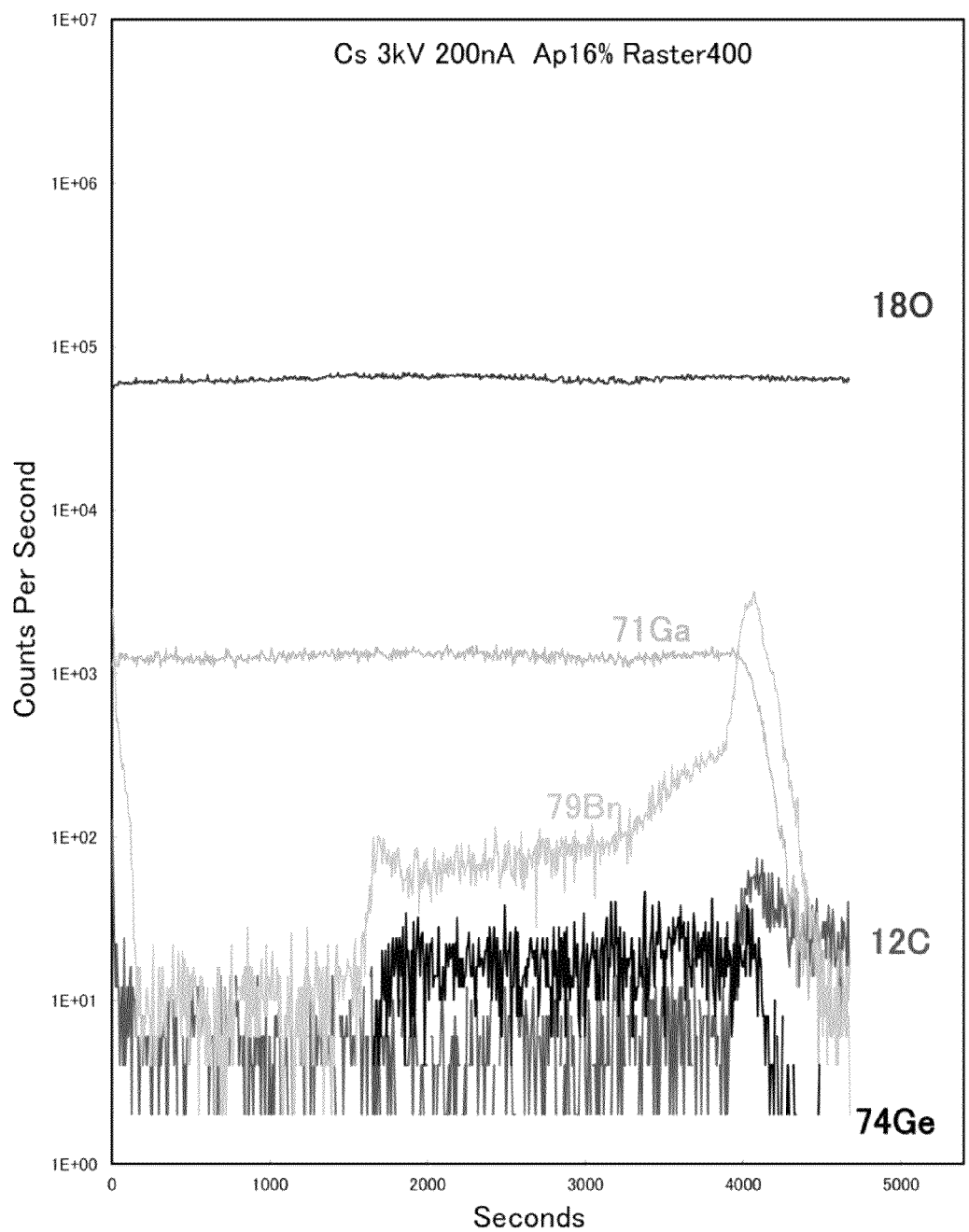
FIG. 21 is a diagram showing the result of an SIMS analysis of a semiconductor layer in the Example.

A SIMS analysis (Cs, 3 kV, 200 nA, Ap16%, Raster400) of the SBD thus formed was performed. The results are shown in FIG. 21. The horizontal axis of FIG. 21 represents the time which elapsed since the start of sputtering. This graph indicates that while no germanium was contained until about 1500 seconds elapsed, germanium was contained uniformly during a period from when about 1500 seconds elapsed to when about 4000 seconds elapsed. This means that the $n^+$-type semiconductor layer and $n^-$-type semiconductor layer were favorably formed.

Condition 12—Off-Angle Substrate and Ge Doping

A crystalline multilayer structure was obtained in the same as in condition 1 except that a c-plane sapphire substrate having an off-angle of 4 degrees was used as the substrate.

Test Example

The crystalline multilayer structures obtained in conditions 1, 4, 5, and 12 were subjected to annealing under the conditions shown in Table 4, and the changes in electrical resistance caused by annealing were measured. The result is shown in Table 4. In Table 4, "O" (circle) indicates that the electrical resistance was reduced or not changed, and "X" indicates that the electrical resistance was increased. "XX" indicates that the electrical resistance was so increased that the resistance was not detected when 1000V was applied by use of an insulation resistance tester. "-" indicates that no measurement was made.

TABLE 4

| | | Change in electrical resistance | | | |
|---|---|---|---|---|---|
| | | Condition 12 off-angle: 4 deg. Ge | Condition 1 Ge | Condition 5 Si | Condition 4 Sn |
| Annealing conditions (ambient gas, | $H_2 + N_2$ 500° C. 30 min. | ○ | — | — | X |

TABLE 4-continued

|  |  | Change in electrical resistance | | | |
|---|---|---|---|---|---|
|  |  | Condition 12 off-angle: 4 deg. Ge | Condition 1 Ge | Condition 5 Si | Condition 4 Sn |
| treatment temperature, treatment time | $N_2$ 500° C. 30 min. | ○ | ○ | ○ | XX |
|  | $O_2$ 450° C. 30 min. | ○ | ○ | — | XX |

The crystalline multilayer structure of the present invention can be used in all fields, including semiconductors (e.g., compound semiconductor electronic devices), electronic components/electric apparatus components, optical/electronic photograph-related devices, and industrial members. Since this crystalline multilayer structure has good semiconductor properties, it is particularly useful for semiconductor devices.

The embodiments of the invention in which an exclusive property or privilege is claimed are defined as follows:

1. A crystalline multilayer structure comprising:
   a base substrate; and
   a crystalline oxide semiconductor thin film disposed directly on the base substrate or with another layer therebetween and comprising a corundum-structured oxide semiconductor as a major component,
   wherein the oxide semiconductor contains one or both of indium or gallium as a major component, and
   wherein the crystalline oxide semiconductor thin film contains germanium and is substantially free of carbon.

2. The crystalline multilayer structure of claim 1, wherein the crystalline oxide semiconductor thin film contains germanium.

3. The crystalline multilayer structure of claim 1, wherein a concentration of germanium in the crystalline oxide semiconductor thin film is $1\times10^{16}/cm^3$ to $1\times10^{22}/cm^3$.

4. The crystalline multilayer structure of claim 1, wherein a concentration of germanium in the crystalline oxide semiconductor thin film is $1\times10^{17}/cm^3$ or less.

5. The crystalline multilayer structure of claim 1, wherein a concentration of germanium in the crystalline oxide semiconductor thin film is $1\times10^{20}/cm^3$ or more.

6. The crystalline multilayer structure of claim 1, wherein the oxide semiconductor is α-phase $In_XAl_YGa_ZO_3$ in which $0\leq X\leq 2$, $0\leq Y\leq 2$, $0\leq Z\leq 2$, $X+Y+Z=1.5$ to $2.5$, and $0<X$ or $0<Z$.

7. A semiconductor device comprising the crystalline multilayer structure of claim 1.

8. A semiconductor device comprising the crystalline multilayer structure of claim 1 and an electrode.

9. A semiconductor device comprising:
   a semiconductor layer comprising a crystalline oxide semiconductor thin film containing a corundum-structured oxide semiconductor as a major component; and
   an electrode,
   wherein the oxide semiconductor contains one or both of indium or gallium as a major component, and
   wherein the crystalline oxide semiconductor thin film contains germanium and is substantially free of carbon.

10. The semiconductor device of claim 7, wherein the semiconductor device is a vertical device.

11. The semiconductor device of claim 7, wherein the semiconductor device is a power device.

12. The semiconductor device of claim 7, wherein the semiconductor device is a Schottky barrier diode (SBD), a metal semiconductor field-effect transistor (MESFET), a high-electron-mobility transistor (HEMT), a metal oxide semiconductor field-effect transistor (MOSFET), a static induction transistor (SIT), a junction field-effect transistor (JFET), an insulated gate bipolar transistor (IGBT), or a light-emitting diode (LED).

13. The semiconductor device of claim 7, wherein the semiconductor device is a Schottky barrier diode (SBD), a metal oxide semiconductor field-effect transistor (MOSFET), a metal semiconductor field-effect transistor (MESFET), a high-electron-mobility transistor (HEMT), or a static induction transistor (SIT).

* * * * *